(12) United States Patent
Chang et al.

(10) Patent No.: US 11,460,633 B2
(45) Date of Patent: Oct. 4, 2022

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Chih-Chieh Chang, Hsinchu (TW); Chung-Hao Tsai, Changhua County (TW); Chen-Hua Yu, Hsinchu (TW); Chuei-Tang Wang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 9 days.

(21) Appl. No.: 17/214,920

(22) Filed: Mar. 28, 2021

(65) Prior Publication Data

US 2021/0239902 A1  Aug. 5, 2021

Related U.S. Application Data

(63) Continuation of application No. 16/569,673, filed on Sep. 13, 2019, now Pat. No. 10,962,711.

(60) Provisional application No. 62/773,158, filed on Nov. 29, 2018.

(51) Int. Cl.
*G02B 6/12* (2006.01)
*G02B 6/13* (2006.01)

(52) U.S. Cl.
CPC ........... *G02B 6/12004* (2013.01); *G02B 6/12* (2013.01); *G02B 6/13* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,962,711 B2 * | 3/2021 | Chang ............... G02B 6/12004 |

* cited by examiner

*Primary Examiner* — Michael Stahl
(74) *Attorney, Agent, or Firm* — JCIPRNET

(57) ABSTRACT

A semiconductor package and a manufacturing method thereof are provided. The semiconductor package includes a photonic die, an encapsulant and a wave guide structure. The photonic die includes: a substrate, having a wave guide pattern formed at front surface; and a dielectric layer, covering the front surface of the substrate, and having an opening overlapped with an end portion of the wave guide pattern. The encapsulant laterally encapsulates the photonic die. The wave guide structure lies on the encapsulant and the photonic die, and extends into the opening of the dielectric layer, to be optically coupled to the wave guide pattern.

20 Claims, 35 Drawing Sheets

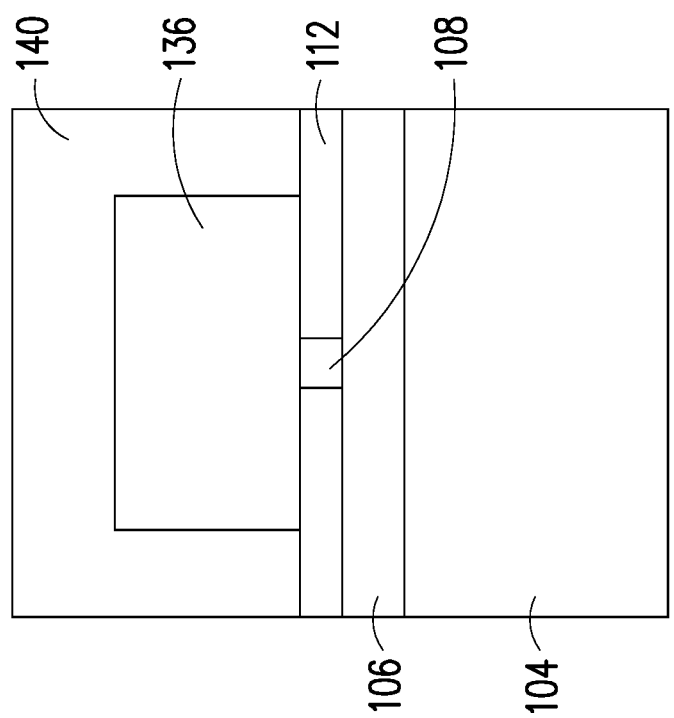

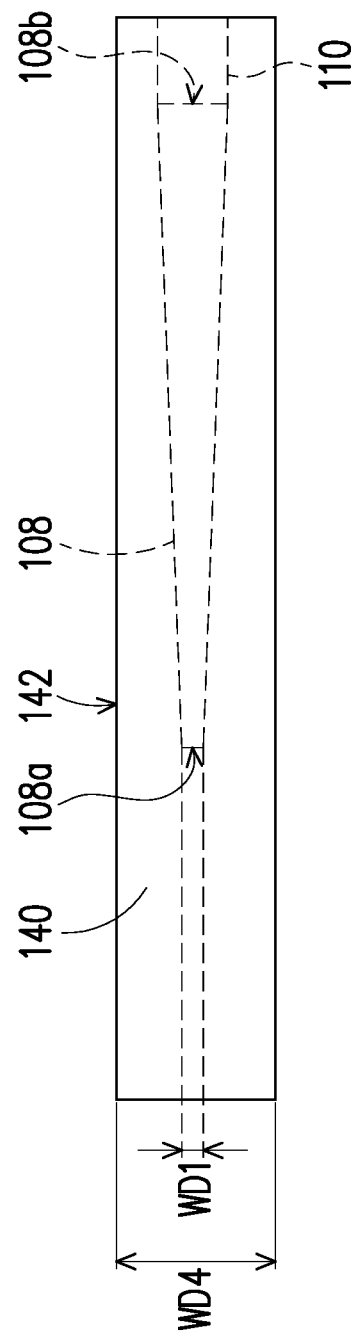

SEMICONDUCTOR PACKAGE AND MANUFACTURING METHOD THEREOF

CROSS-REFERENCE TO RELATED APPLICATION

This application is a continuation application of and claims the priority of a prior application Ser. No. 16/569,673, filed on Sep. 13, 2019, now allowed. The prior application claims the priority benefit of U.S. provisional application Ser. No. 62/773,158, filed on Nov. 29, 2018. The entirety of the above-mentioned patent applications is hereby incorporated by reference herein and made a part of this specification.

BACKGROUND

Photonic dies, also known as photonic integrated circuits (PICs), have been integrated with a number of semiconductor technologies. Such integrated devices may have improved performance and/or additional functionality. However, current manners for realizing optical communication among the photonic dies are limited to certain package structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a cross-sectional view along an A-A' line illustrated in FIG. 3A.

FIG. 3D is an exemplary top view of the wave guide structure and the underlying portion of the wave guide pattern as shown in FIG. 3A.

DETAILED DESCRIPTION

Figure 1:
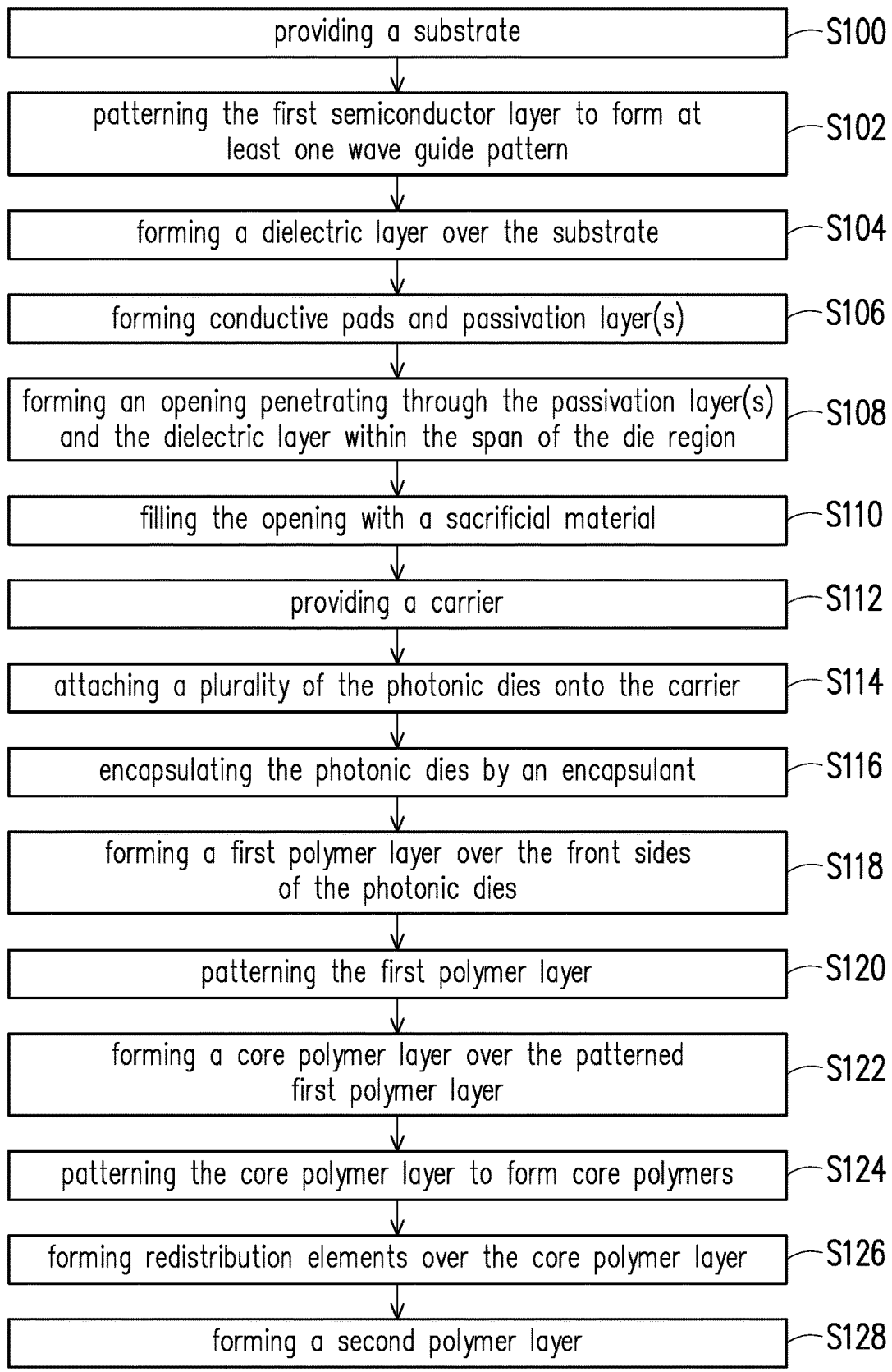
FIG. 1 is a process flow diagram illustrating a manufacturing method of a semiconductor package according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

Embodiments will be described with respect to a specific context, namely a photonic integrated circuit (PIC) in a semiconductor package. However, to other circuits and layouts is desired. Throughout the various views and illustrative embodiments, like reference numbers are used to designate like elements.

Figure 2A:
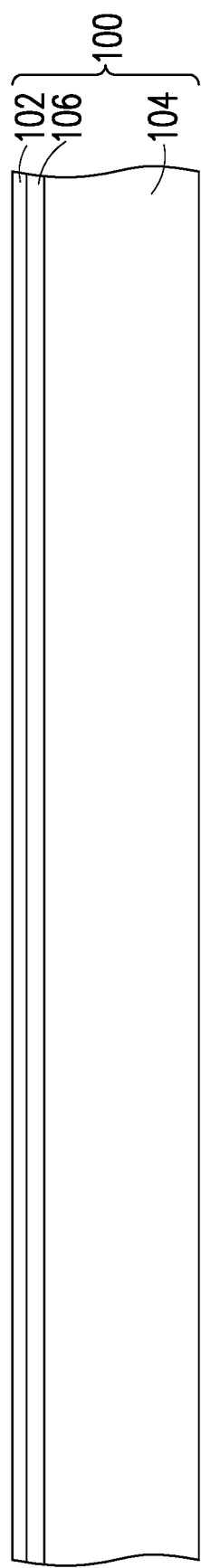
FIG. 2A through FIG. 2O are cross-sectional views illustrating structures at various stages during the manufacturing method of the semiconductor package shown in FIG. 1.

FIG. 1 is a process flow diagram illustrating a manufacturing method of a semiconductor package according to some embodiments of the present disclosure. FIG. 2A through FIG. 2O are cross-sectional views illustrating structures at various stages during the manufacturing method of the semiconductor package shown in FIG. 1.

Referring to FIG. 1 and FIG. 2A, step S100 is performed, and a substrate 100 is provided. In some embodiments, the substrate 100 is a semiconductor-on-insulator (SOI) wafer. In these embodiments, the substrate 100 includes a first semiconductor layer 102, a second semiconductor layer 104 and a buried insulating layer 106 embedded between the first and second semiconductor layers 102 and 104. The first semiconductor layer 102 may be regarded as a thin semiconductor layer, whereas the second semiconductor layer 104 may be regarded as a bulk semiconductor substrate. For instance, a thickness of the first semiconductor layer 102 may range from 100 nm to 300 nm. In some embodiments, materials of the first and second semiconductor layers 102 and 104 respectively include an elemental semiconductor material, a compound semiconductor material, or a semiconductor alloy. For instance, the elemental semiconductor may include Si or Ge. The compound semiconductor and the semiconductor alloy may respectively include SiGe, SiC, SiGeC, a III-V semiconductor or a II-VI semiconductor. For instance, the III-V semiconductor includes GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs or InAlPAs. The II-VI semiconductor may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe or HgZnSTe.

Figure 2B:
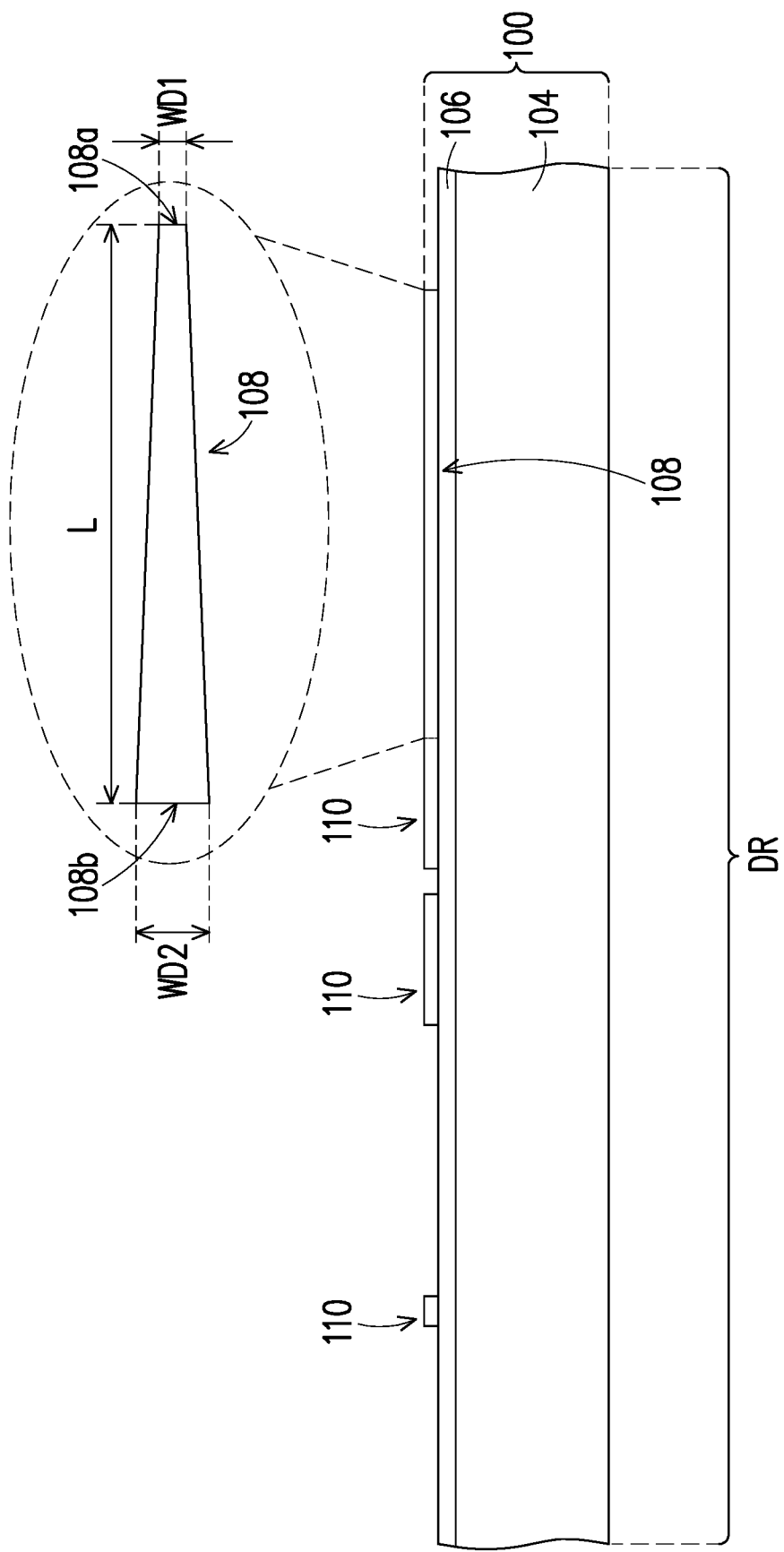

Referring to FIG. 1, FIG. 2A and FIG. 2B, step S102 is performed, and the first semiconductor layer 102 is patterned to form at least one wave guide pattern 108. As such, the wave guide pattern 108 may be regarded as being formed at a surface of the substrate 100. In some embodiments, the substrate 100 has a plurality of die regions DR, and some of the die regions DR respectively have the at least one wave guide pattern 108. In some embodiments, the wave guide pattern 108 is functioned as an optical transmitter or an optical receiver. In these embodiments, the wave guide pattern 108 is formed as a rod shape, and may extend from a peripheral area of the die region DR to a central area of the die region DR. The area enclosed by a dash line in FIG. 2B shows an exemplary top view of the wave guide pattern 108. In some embodiments, the wave guide pattern 108 has a tapered top view shape. For instance, such top view shape of the wave guide pattern 108 is tapered toward an edge of the die region DR. As such, the narrow end 108a of the wave guide pattern 108 has a rather small width WD1 close to the edge of the die region DR, and the wide end 108b of the wave guide pattern 108 has a rather large width WD2 away from the edge of the die region DR. For instance, the width WD1 may range from 50 nm to 150 nm, whereas the width WD2 may range from 150 nm to 500 nm. In addition, a length L of the wave guide pattern 108 may range from 50 μm to 2000 μm. On the other hand, a thickness of the wave guide pattern 108 is substantially equal to the thickness of the first semiconductor layer 102 as shown in FIG. 2A. It should be noted that, even though only one wave guide pattern 108 is depicted in the die region DR as shown in FIG. 1B, two or more of the wave guide patterns 108 may be actually formed in the die region DR. In some embodiments, the wave guide patterns 108 may be arranged along a width direction of the wave guide pattern 108. The width direction of the wave guide pattern 108 is referred as a direction intersected (e.g., perpendicular) to a long axis of the wave guide pattern 108.

In addition to the formation of the wave guide pattern(s) 108, a plurality of optical devices 110 may be formed within the die region DR by the patterning operation performed on the first semiconductor layer 102. The wave guide pattern 108 may be connected with an adjacent one of the optical devices 110, and such wave guide pattern 108 and optical device 110 may be regarded as different portions of the same semiconductor pattern. A dash line depicted in the cross-sectional view of this semiconductor pattern indicates a boundary between the wave guide pattern 108 and the adjacent optical device 110. However, such boundary is imaginary, and only depicted for illustration purpose only. In certain embodiments, the formation of some of the optical devices 110 further includes forming additional layers (not shown) on the patterned first semiconductor layer 102. For instance, the optical devices 110 may respectively include a modulator, an optical detector, an optical amplifier, an optical coupler, a filter, a detector or so forth. Those skilled in the art may modify the amount and type of each optical device 110 according to design requirements, the present disclosure is not limited thereto.

Figure 2C:
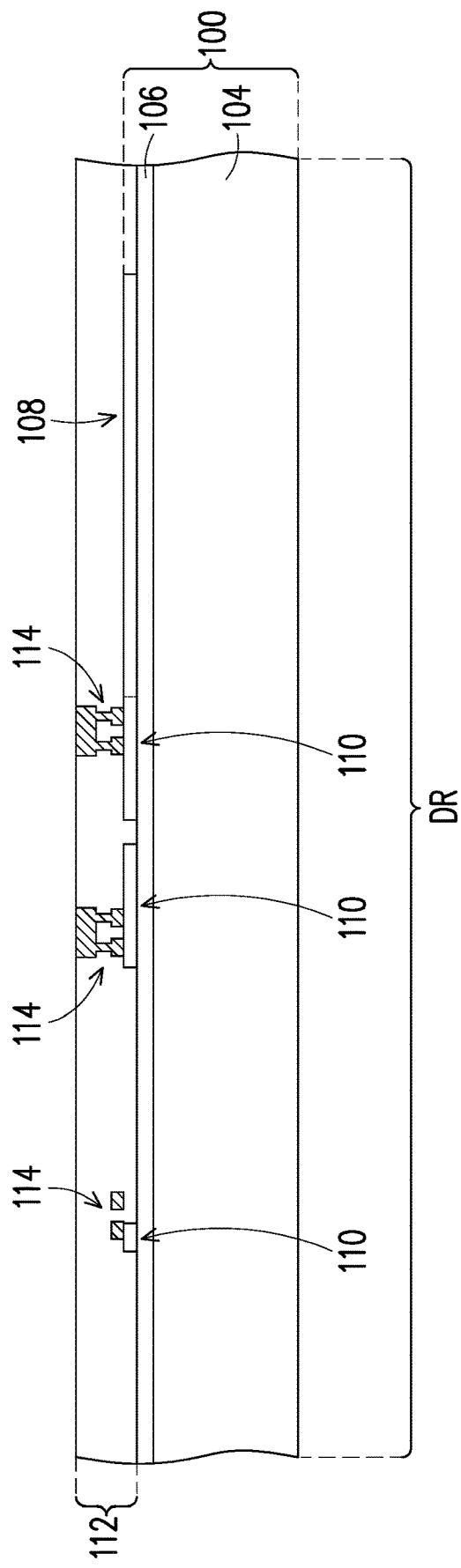

Referring to FIG. 1 and FIG. 2C, Step S104 is performed, and a dielectric layer 112 is formed over the substrate 100. The wave guide pattern 108 and the optical devices 110 are covered by the dielectric layer 112. In some embodiments, the dielectric layer 112 is a multilayer structure, and includes a stack of sub-layers (not shown). In addition, a plurality of interconnection structures 114 may be formed in the dielectric layer 112. The interconnection structures 114 may include conductive vias, conductive lines or a combination thereof. The conductive via penetrates one of the sub-layers of the dielectric layer 112, whereas the conductive line lies on one of the sub-layers of the dielectric layer 112. The interconnection structures 114 (e.g., the conductive via of the interconnection structures 114) may be electrically connected with the optical devices 110. In some embodiments, material(s) of the dielectric layer 112 may include silicon oxide, silicon nitride or a combination thereof. In addition, material(s) of the interconnection structure 114 may include W, Cu, Al, Ti, Ta, the like or combinations thereof.

Figure 2D:
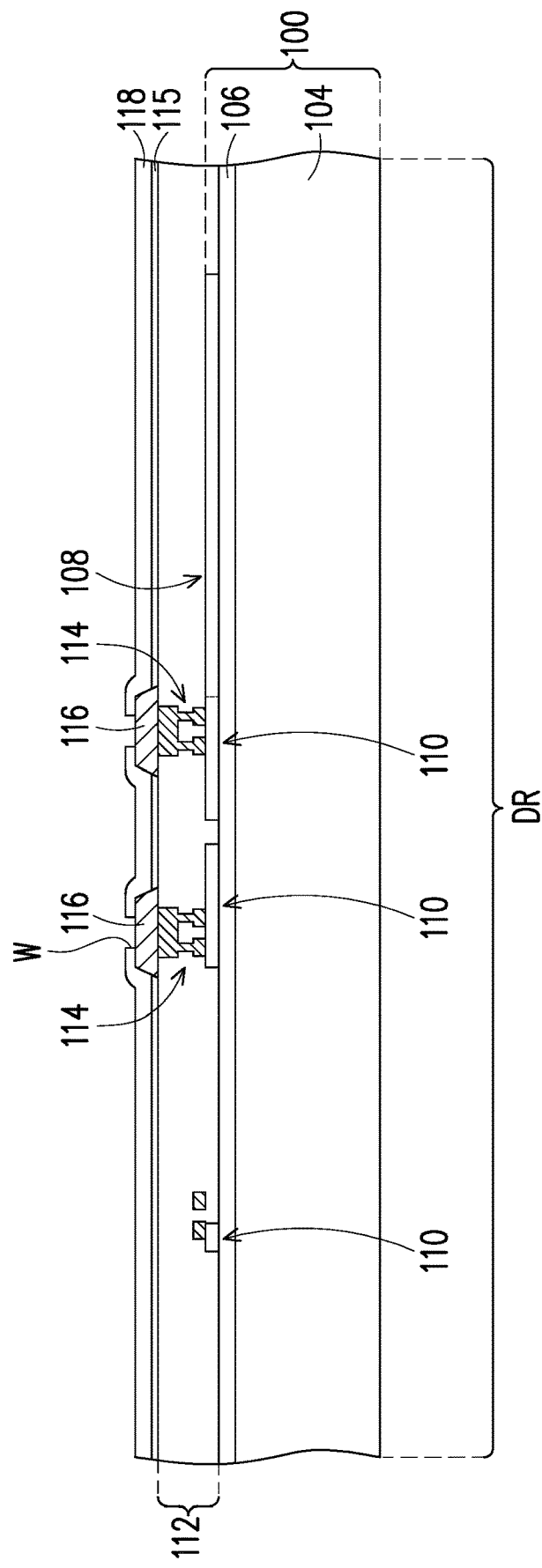

Referring to FIG. 1 and FIG. 2D, step S106 is performed, and conductive pads 116 and a passivation layer 118 are formed. The conductive pads 116 are formed over the dielectric layer 112, and electrically connected with the interconnection structures 114. The passivation layer 118 are formed over the dielectric layer 112 and the conductive pads 116, and has a plurality of openings W respectively exposing top surfaces of the conductive pads 116. In some embodiments, a material of the conductive pads 116 may include Al, Cu, Au or combinations thereof. In addition, a material of the passivation layer 118 may include silicon oxide, silicon nitride, the like or combinations thereof.

In some embodiments, an additional passivation layer 115 may be disposed on the dielectric layer 112 before forming the conductive pads 116 and the passivation layer 118. The additional passivation layer 115 has a plurality of openings defining locations and dimensions of the conductive pads 116. In these embodiments, after forming the conductive pads 116, the conductive pads 116 may be regarded as being laterally surrounded by the passivation layer 115. Thereafter, the passivation layer 118 is disposed on the passivation layer 115 and the conductive pads 116. A material of the passivation layer 115 may include silicon oxide, silicon nitride, the like or combinations thereof. In some embodiments, a material of the passivation layer 115 is the same as the material of the passivation layer 118. In other embodiments, the material of the passivation layer 115 is different from the material of the passivation layer 118. In addition, the passivation layer 115 and the passivation layer 118 may be respectively formed by a spin coating process or a deposition process (e.g., a chemical vapor deposition (CVD) process), whereas the conductive pads 116 may be formed by a plating process.

Figure 2E:
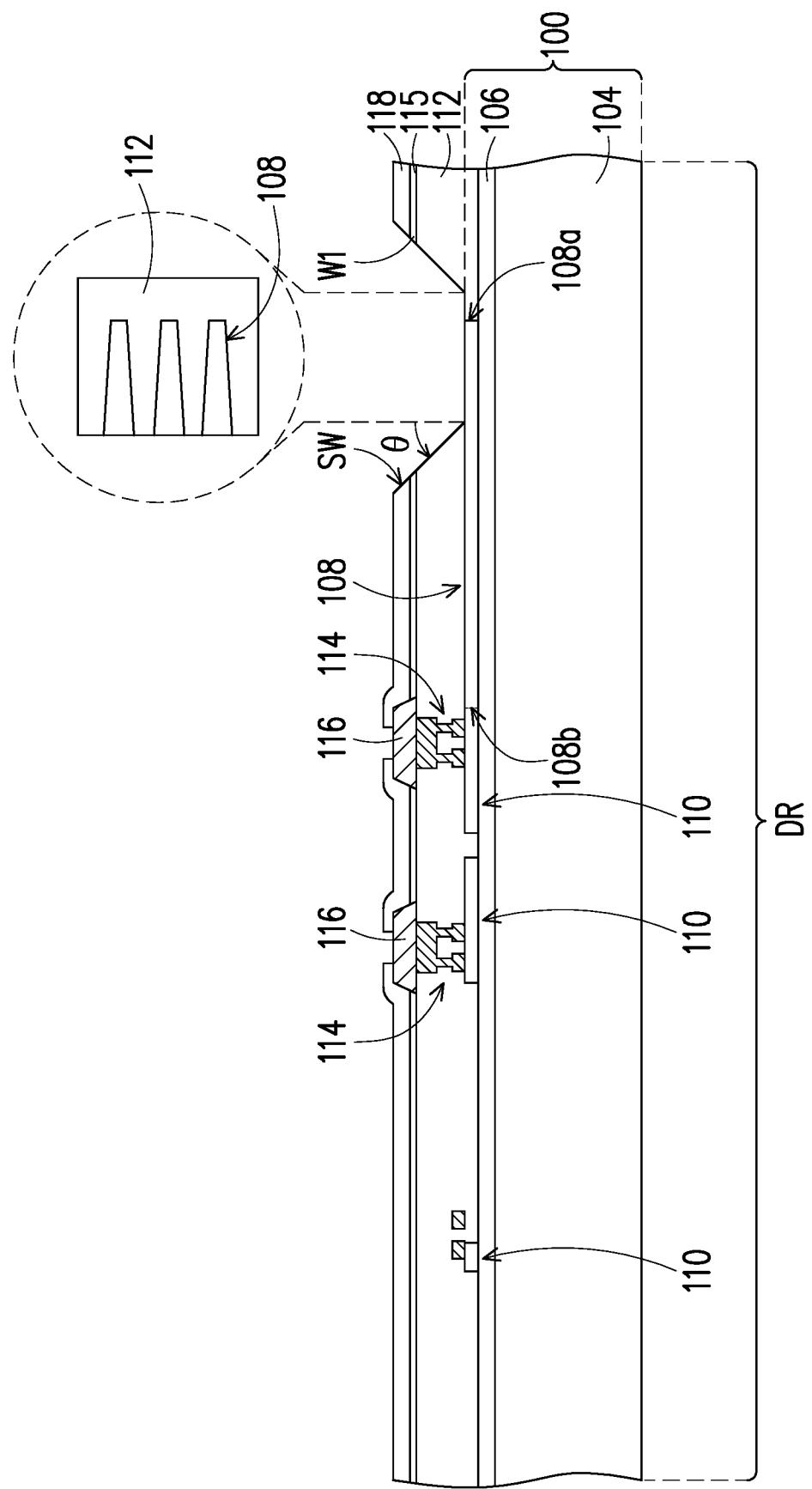

Referring to FIG. 1, FIG. 2D and FIG. 2E, step S108 is performed, and an opening W1 penetrating through the passivation layer 118, the passivation layer 115 and extending into the dielectric layer 112 is formed within the die region DR. A portion of the wave guide pattern 108 is exposed by the opening W1. In some embodiments, the narrow end 108a of the wave guide pattern 108 is located within the opening W1, whereas the wide end 108b of the wave guide pattern 108 is located outside the opening W1 and buried by the dielectric layer 112. The area enclosed by a dash line shown in FIG. 2E illustrates an exemplary top view of a bottom surface of the opening W1. As shown in this exemplary top view, a plurality of the wave guide patterns 108 are exposed at the bottom surface of the opening W1, and are surrounded by a portion of the dielectric layer 112. In some embodiments, the opening W1 is formed by a photolithography process and at least one etching process. In these embodiments, a photoresist pattern (not shown) having an opening defining location and dimension of the opening W1 is formed on the wafer structure shown in FIG. 2D. Afterwards, at least one anisotropic etching process is performed on the passivation layer 118, the passivation layer 115 and the dielectric layer 112 by using this photoresist pattern as a mask, so as to form the opening W1. By adjusting dimension of the opening in the photoresist pattern and orientation of the anisotropic etching process, the opening W1 may be formed to have a tilt sidewall SW. For instance, an angle θ between the tilt sidewall SW and a normal direction (illustrated by a dash line shown in FIG. 2E) of the top surface of the wave guide pattern 108 ranges from 0° to 45°. Thereafter, the photoresist pattern is removed by, for example, an ashing process or a stripping process. It should be noted that, even though only one opening W1 is depicted in FIG. 2E, two or more of the openings W1 may be actually formed. The amount of the opening(s) W1 is dependent on the amount of the wave guide pattern(s) 108 in the die region DR, the present disclosure is not limited to these amounts.

Figure 2F:
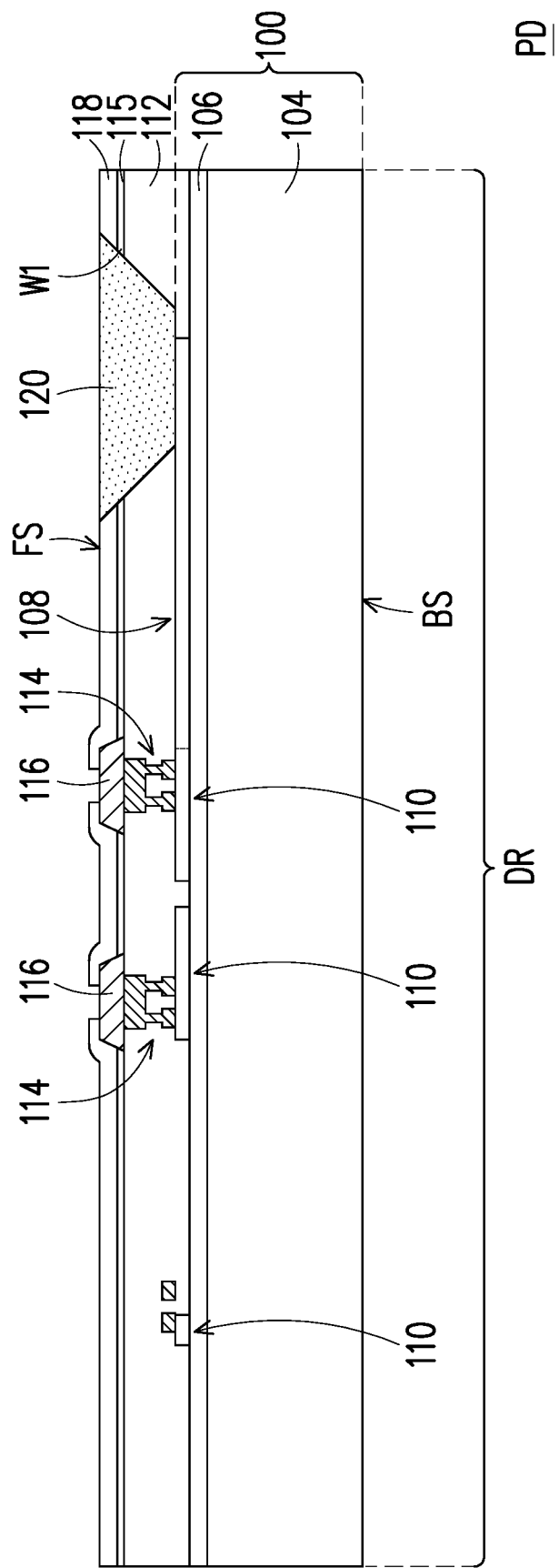

Referring to FIG. 1, FIG. 2E and FIG. 2F, step S110 is performed, and the opening W1 is filled with a sacrificial material 120. In some embodiments, a formation method of the sacrificial material 120 may include filling an initial sacrificial material (not shown) in the opening W1 by, for example, a spin coating process or a deposition process. A top surface of the initial sacrificial material (not shown) may be higher than a top surface of the passivation layer 118. Afterwards, a portion of the initial sacrificial material above the top surface of the passivation layer 118 may be removed by a planarization process, so as to form the sacrificial material 120. In some embodiments, a top surface of the sacrificial material 120 is substantially coplanar with the top surface of the passivation layer 118. For instance, the planarization process may include an etching back process. A material of the sacrificial material 120 may be similar to a material of a die attach film (DAF), or may include a removable glue, epoxy, the like, another type of material or a combination thereof.

After forming the sacrificial material 120, a singulation process may be performed on the current wafer structure. The singulated structures may respectively contain one of the die regions DR, and be respectively referred as a photonic die PD. In some embodiments, the singulation process may include a sawing process, a laser ablation process, an etching process, the like or combinations thereof.

Figure 2G:
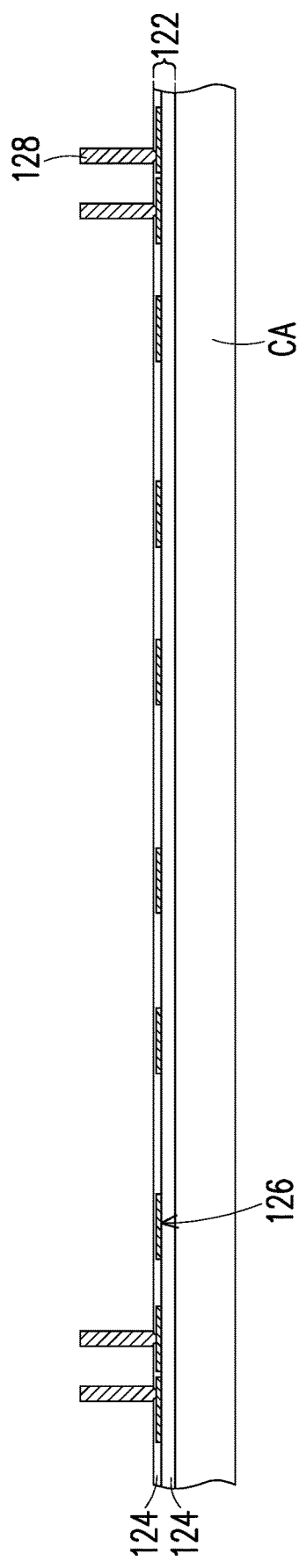

Referring to FIG. 1 and FIG. 2G, step S112 is performed, and a carrier CA is provided. In some embodiments, the carrier CA is a glass carrier, but the present disclosure is not limited thereto. In addition, an adhesion layer (not shown) may be formed on a surface of the carrier CA, to which the photonic dies PD are attached in the following steps. For instance, the adhesion layer may be a light to heat conversion (LTHC) layer or a thermal release layer. In some embodiments, a redistribution structure 122 may be formed on the carrier CA. In those embodiments of which an adhesion layer is pre-formed, the adhesion layer (not shown) is located between the carrier CA and the redistribution structure 122. The redistribution structure 122 may include one or more dielectric layers 124 and interconnection elements 126 formed in the dielectric layer(s) 124. Even though the redistribution structure 122 shown in FIG. 2G is depicted as having two dielectric layers 124, three or more dielectric layer(s) 124 may actually be included in the redistribution structure 122. In addition, the interconnection elements 126 may include conductive vias, conductive lines or combinations thereof, and may be distributed in the dielectric layer(s) 124. Furthermore, in some embodiments, conductive pillars 128 may be formed on the redistribution structure 122. The conductive pillars 128 may extend into the topmost dielectric layer 124, and electrically connect with the interconnection elements 126. In some embodiments, a formation method of the conductive pillar 128 may include forming a seed layer (not shown) on the redistribution structure 122. Then, a photoresist pattern (not shown) having openings to define locations and dimensions of the conductive pillars 128 are formed on the seed layer. Thereafter, a plating process may be performed to fill the openings of the photoresist pattern with a conductive material, so as to form the conductive pillars 128. After forming the conductive pillars 128, the photoresist pattern and the underlying portions of the seed layer are removed. For instance, the conductive material may include Cu, Al, Ti, the like or combinations thereof.

Figure 2H:
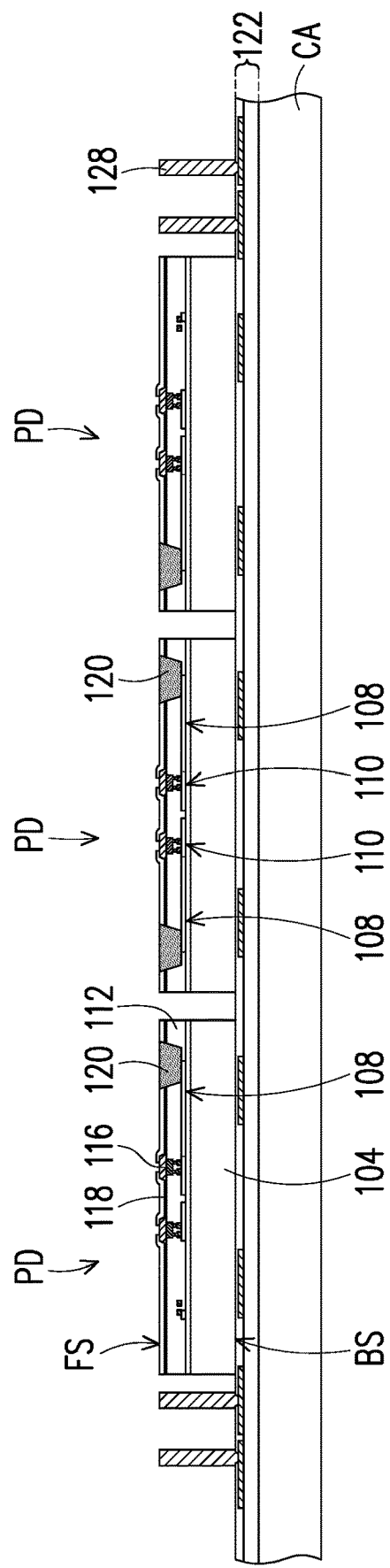

Referring to FIG. 1 and FIG. 2F through FIG. 2H, step S114 is performed, and a plurality of the photonic dies PD are attached onto the carrier CA. The photonic die PD has a front side FS and a back side BS opposite to the front side FS. In some embodiments, the top surfaces of the sacrificial material 120, the passivation layer 118 and the conductive pads 116 are exposed at the front side FS of the photonic die PD, whereas a bottom surface of the second semiconductor layer 104 may be referred as the back side BS of the photonic die PD. The back sides BS of the photonic dies PD may be attached onto the carrier CA. As such, the back sides BS of the photonic dies PD may face toward the carrier CA, whereas the front sides FS of the photonic dies PD may face away from the carrier CA. In those embodiments of which the redistribution structure 122 is formed over the carrier CA, the photonic dies PD are attached onto the redistribution structure 122. In addition, in some embodiments, the photonic dies PD are located between adjacent conductive pillars 128. It should be noted that, even though three of the photonic dies PD are depicted in FIG. 2H, those skilled in the art may adjust the amount of the photonic dies PD attached to the carrier CA according to design requirements. In some embodiments, wave guide patterns 108 as well as the openings W1 are formed at multiple sides of some of the photonic dies PD (e.g., the middle photonic die PD depicted in FIG. 2H), for communicating with adjacent photonic dies PD in various directions.

Figure 2I:
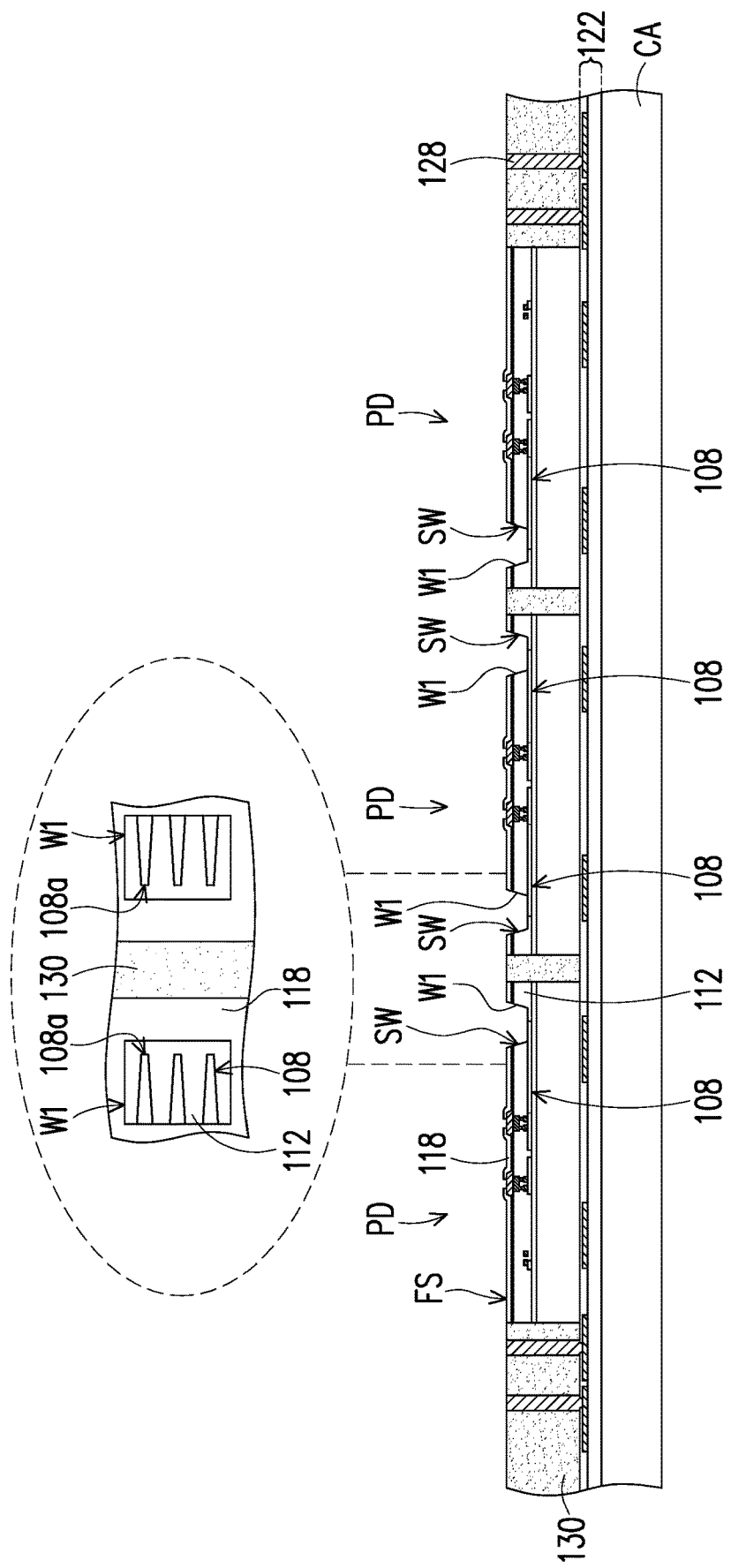

Referring to FIG. 1 and FIG. 2I, step S116 is performed, and the photonic dies PD are encapsulated by an encapsulant 130. The photonic dies PD may be initially over-molded by the encapsulant 130, and a planarization process may be performed on the encapsulant 130 to expose the front sides FS of the photonic dies PD. In some embodiments, the front sides FS of the photonic dies PD may be substantially coplanar with a top surface of the encapsulant 130. In those embodiments of which the conductive pillars 128 are formed over the carrier CA, the conductive pillars 128 are laterally encapsulated by the encapsulant 130 as well. In addition, top surfaces of the conductive pillars 128 may be substantially coplanar with the top surface of the encapsulant 130.

In the above-mentioned embodiments, the step of forming the encapsulant 130 follows the step of forming the conductive pillars 128. However, in alternative embodiments, the step of forming the encapsulant 130 may precede the step of forming the conductive pillars 128. In these embodiments, some portions of the encapsulant 130 are removed to form through holes in the encapsulant 130, and a conductive material is filled in these through holes to form the conductive pillars 128.

In some embodiments, after the photonic dies PD are molded by the encapsulant 130, the sacrificial materials 120 (as shown in FIG. 2H) filled in the openings W1 may be removed. The area enclosed by a dash line in FIG. 2I shows an exemplary top view of the openings W1 of adjacent photonic dies PD. As shown in this exemplary top view, portions of the wave guide patterns 108 and the dielectric layer 112 in the openings W1 are exposed. In addition, the narrow ends 108a of the wave guide patterns 108 in these adjacent photonic dies PD are facing each other. As shown in the cross-sectional view, the sidewalls SW of the openings W1 are exposed. In some embodiments, the sacrificial materials 120 may be removed by an etching process, such as an anisotropic etching process or an isotropic etching process.

Figure 2J:
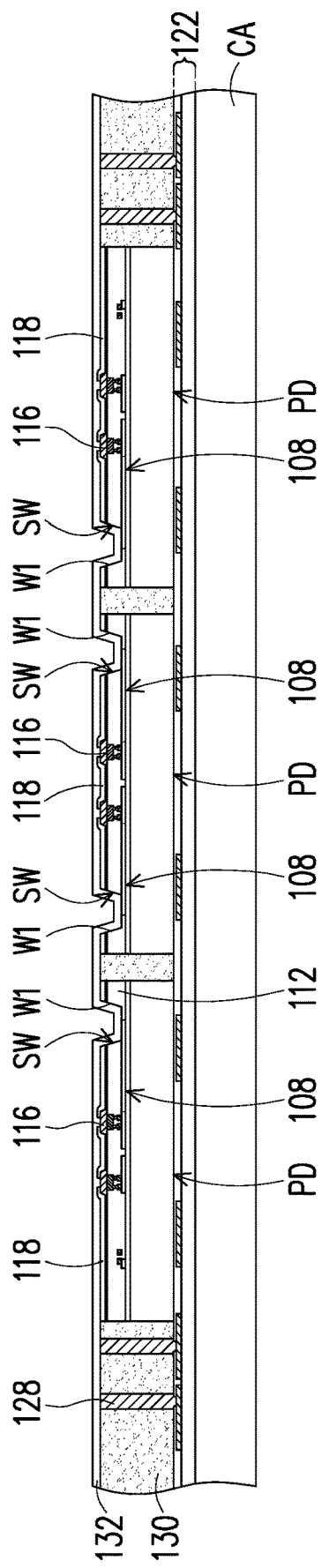

Referring to FIG. 1, FIG. 2I and FIG. 2J, step S118 is performed, and a first polymer layer 132 is formed over the front sides FS of the photonic dies PD. In some embodiments, the first polymer layer 132 extends into the openings W1, and the exposed portions of the wave guide patterns 108 (as shown in FIG. 2I) and dielectric layer 112 as well as the sidewalls SW of the openings W1 are currently covered by the first polymer layer 132. In addition, the top surfaces of the conductive pads 116 and the passivation layer 118 may also be covered by the first polymer layer 132. In some embodiments, substantially the whole surface of the reconstructed wafer as shown in FIG. 2I is covered by the first polymer layer 132. As such, the top surfaces of the encapsulant 130 and the conductive pillars 128 are covered by the first polymer layer 132 as well. In some embodiments, the first polymer layer 132 is formed by a spin coating process or a deposition process. A material of the first polymer layer 132 may include siloxane-based polymers, photosensitive polymer or the like. In addition, a thickness of the first polymer layer 132 may range from 1 µm to 10 µm.

Figure 2K:
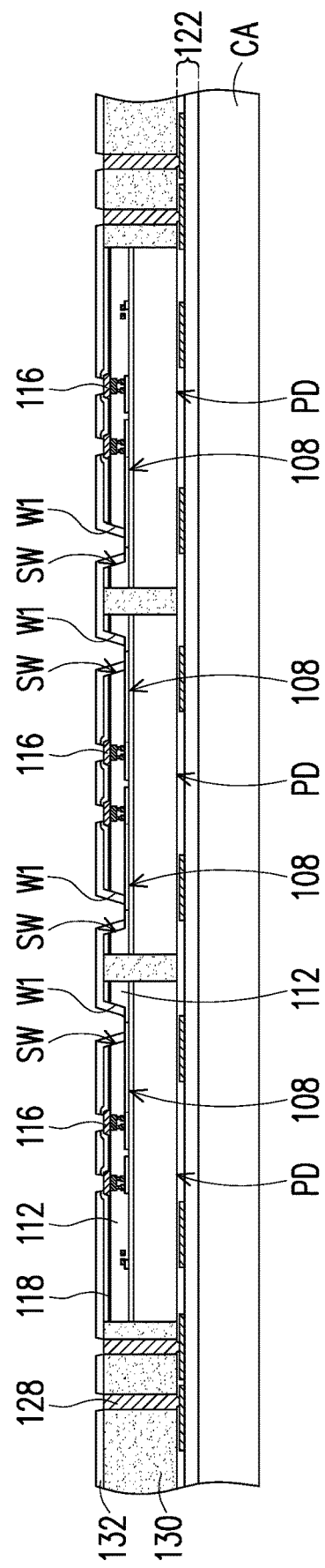

Referring to FIG. 1 and FIG. 2K, step S120 is performed, and the first polymer layer 132 is patterned. As such, some portions of the first polymer layer 132 lying at the bottom surfaces of the openings W1 are removed during the patterning operation performed on the first polymer layer 132, such that the underlying portions of the wave guide patterns 108 and the dielectric layer 112 are exposed at the bottom surfaces of the openings W1. Moreover, additional portions of the first polymer layer 132 may also be removed, so as to expose the conductive pads 116 and the conductive pillars 128. On the other hand, portions of the first polymer layer 132 covering the encapsulant 130, the passivation layer 118 and sidewalls SW of the openings W1 are remained. In some embodiments, the patterning operation performed on the first polymer layer 132 may include a photolithography process and an etching process. For instance, the etching process includes an anisotropic etching process.

Figure 2L:
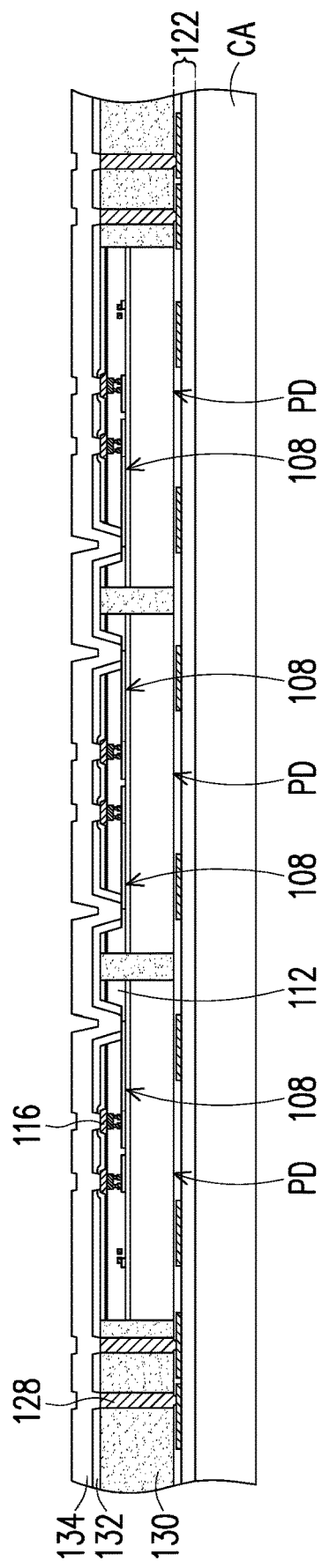

Referring to FIG. 1, FIG. 2K and FIG. 2L, step S122 is performed, and a core polymer layer 134 is formed over the first polymer layer 132. The core polymer layer 134 may be globally formed over the first polymer layer 132, and the portions of the wave guide patterns 108 and dielectric layer 112 that were exposed by the first polymer layer 132 (as shown in FIG. 2K) are currently covered by the core polymer layer 134. In some embodiments, these portions of the wave guide patterns 108 and dielectric layer 112 are in direct contact with the core polymer layer 134. In addition, the conductive pads 116 and the conductive pillars 128 are also covered by the core polymer layer 134. In some embodiments, a formation method of the core polymer layer 134 includes a spin coating process or a deposition process. A material of the core polymer layer 134 is different from the first polymer layer 132. In some embodiments, a refractive index of the material of the core polymer layer 134 is greater than a refractive index of the first polymer layer 132. For instance, the material of the core polymer layer 134 may include siloxane-based polymers, photosensitive polymer or the like, and has a refractive index ranging from 1.5 to 1.9. On the other hand, the material of the first polymer layer 132 may include siloxane-based polymers, photosensitive polymer or the like, and has a refractive index ranging from 1.5 to 1.9. In addition, a thickness of the core polymer layer 134 may range from 1 µm to 10 µm.

Figure 2M:
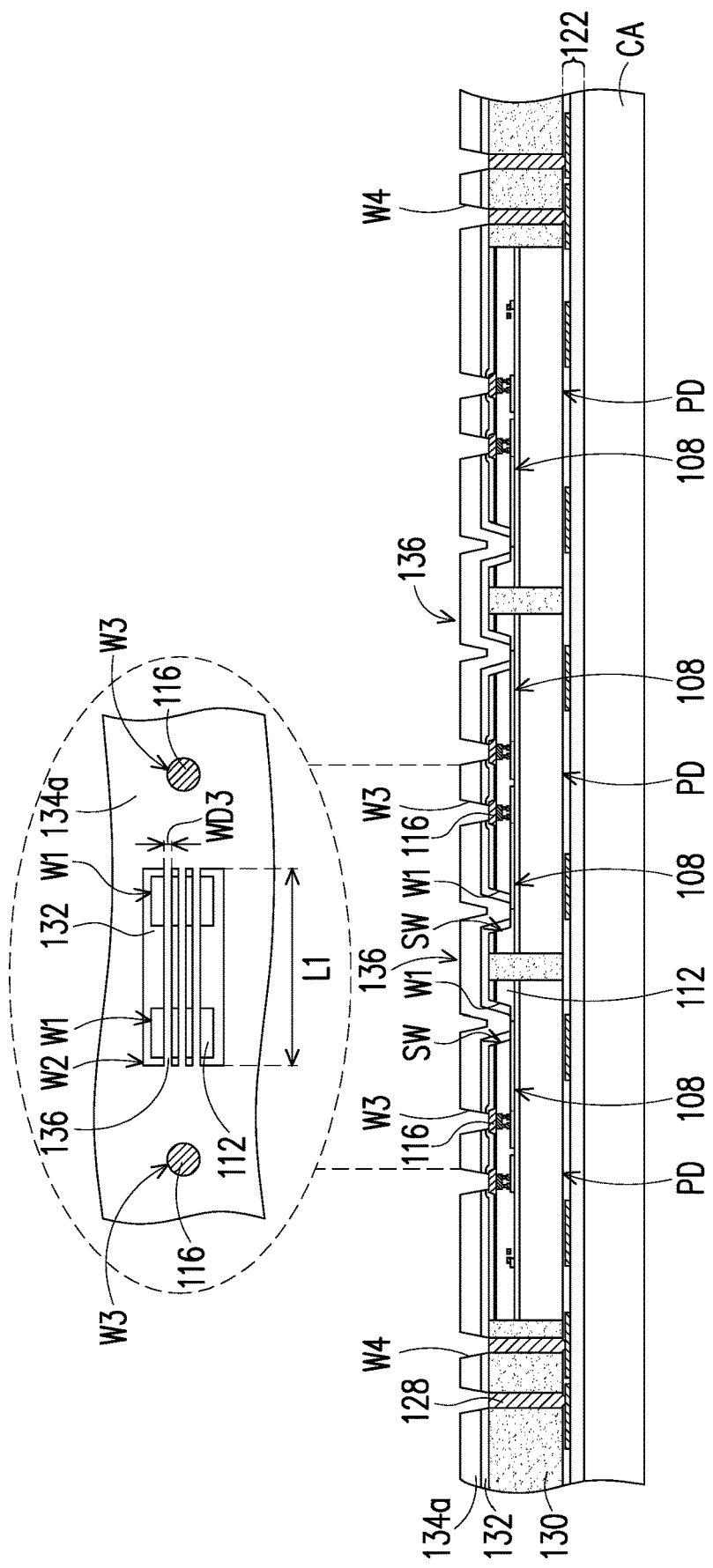

Referring to FIG. 1, FIG. 2L and FIG. 2M, step S124 is performed, and the core polymer layer 134 is patterned to form core polymers 136. The core polymers 136 are portions of the patterned core polymer layer 134a. The area enclosed by a dash line in FIG. 2M is an exemplary top view illustrating the core polymers 136 and elements around the core polymers 136. As shown in the exemplary top view, the patterned core polymer layer 134a has openings W2, and some portions of the patterned core polymer layer 134a extending across the openings W2 are referred as the core polymers 136. A portion of the first polymer layer 132 lying on adjacent photonic dies PD and the encapsulant 130 between these adjacent photonic dies PD is exposed in the opening W2. In addition, the openings W1 of these adjacent photonic dies PD are located in the second opening W2, and surrounded by the above-mentioned portion of first polymer layer 132. The core polymers 136 cross over the openings W1 and the portion of the first polymer layer 132 exposed in the second opening W2. In addition, portions of the wave guide patterns 108 in the first openings W1 are covered by the core polymers 136, whereas some portions of the dielectric layer 112 in the first openings W1 are exposed.

Referring to the exemplary top view in FIG. 2M, in some embodiments, the core polymers 136 are connected between opposite edges of the opening W2. In some embodiments, the core polymers 136 are respectively formed in a rod shape, and may respectively have a substantially constant width WD3. The width WD3 of the core polymer 136 is greater than the width of the wave guide pattern 108 (ranging from the width WD1 to the width WD2, as shown in FIG. 2B). For instance, the width WD3 of the core polymer 136 may range from 1 µm to 10 µm. On the other hand, in some embodiments, a length L1 of the core polymer 136 may be equal to a length of the opening W2, and may range from 1 mm to 100 mm. In some embodiments, the core polymers 136 may be arranged along a width direction of the core polymers 136. An amount of the core polymers 136 may be equal to the amount of the exposed wave guide patterns 108. Although 3 of the core polymers 136 are depicted in the exemplary top view in FIG. 2M, those skilled in the art may adjust both of the amounts of the wave guide patterns 108 and the core polymers 136, the present disclosure is not limited thereto.

Referring to FIG. 2M, as shown in the cross-sectional view, the core polymer 136 crosses over a portion of the encapsulant 130 located between adjacent photonic dies PD, and spans over these adjacent photonic dies PD. Furthermore, the core polymer 136 conformally extends across the openings W1 of the adjacent photonic dies PD. In this way, portions of the first polymer layer 132 lying at the sidewalls SW of the openings W1 as well as the exposed portions of the wave guide patterns 108 in the openings W1 are in contact with the core polymer 136. In some embodiments, these portions of the first polymer layer 132 and these exposed portions of the wave guide patterns 108 are in direct contact with the core polymer 136.

Referring to FIG. 2L and FIG. 2M, furthermore, in some embodiments, during the formation of the opening W2 and the core polymers 136, additional portions of the core polymer layer 134*a* may be removed to form openings W3 and W4. The openings W3 respectively expose the conductive pads 116, whereas the openings W4 respectively expose the conductive pillars 128.

Figure 2N:
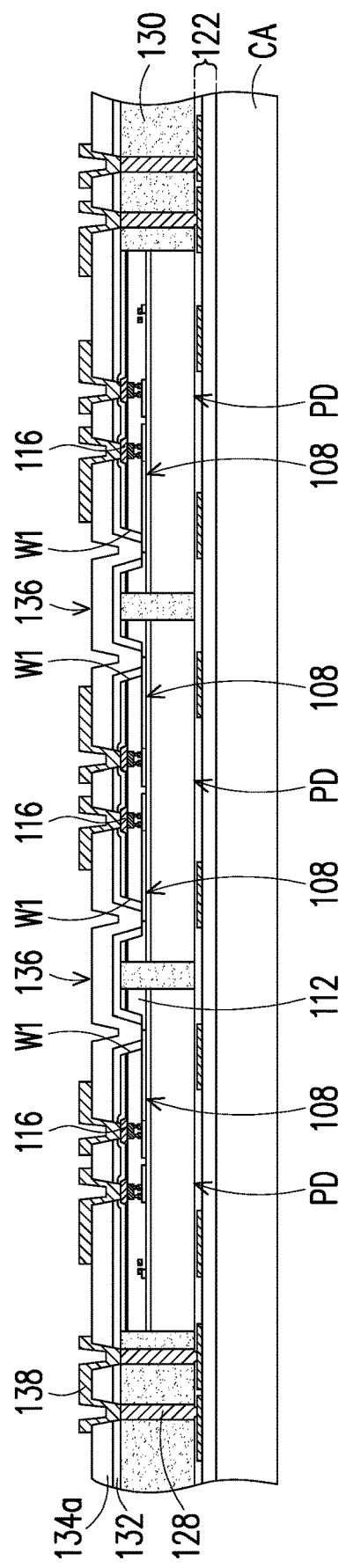
Figure 20:
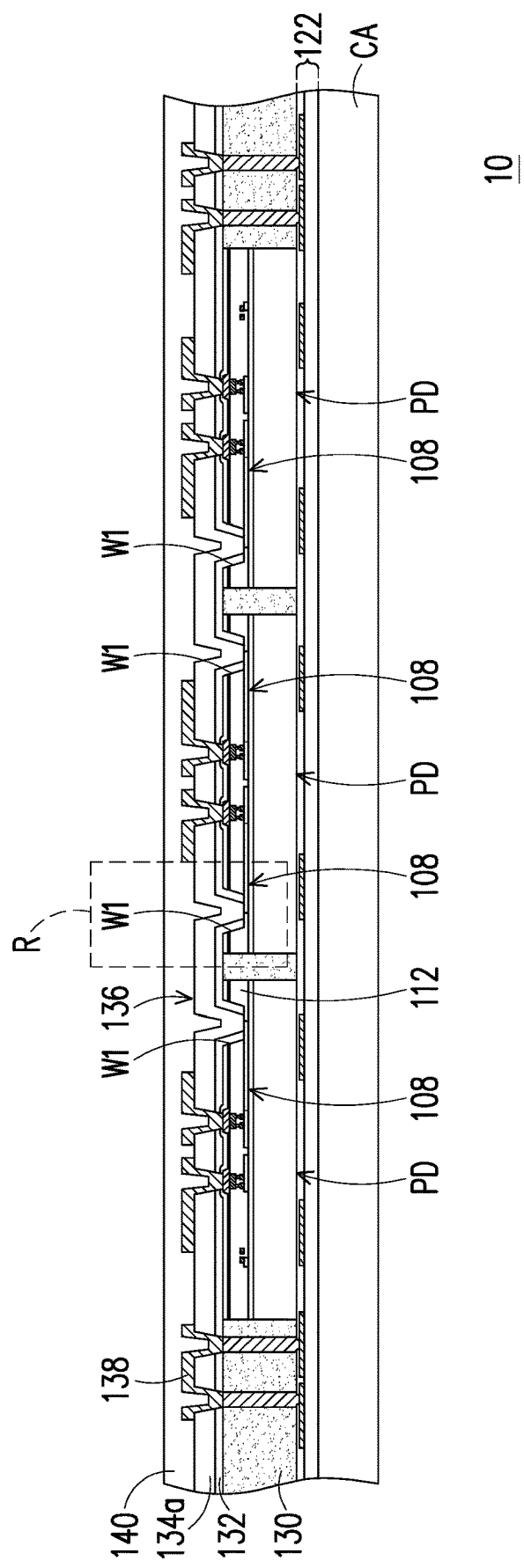

Referring to FIG. 1, FIG. 2M and FIG. 2N, step S126 is performed, and redistribution elements 138 are formed over the core polymer layer 134*a*. The redistribution elements 138 are formed over a top surface of the core polymer layer 134*a*, and extend into the openings W3 and W4 of the core polymer layer 134*a* by which the conductive pads 116 and the conductive pillars 128 are exposed. As such, the redistribution elements 138 are electrically connected with the exposed conductive pads 116 and conductive pillars 128. The redistribution structures 138 may respectively include a conductive via, a conductive trace or a combination thereof. In some embodiments, the redistribution elements 138 can be regarded as fan-out redistribution structures, and the conductive pads 116 and the conductive pillars 128 are out-routed by the redistribution elements 138.

In addition, in some embodiments, the redistribution elements 138 may not extend into the openings W2 (as shown in FIG. 2M), and are not overlapped with the core polymers 136. A formation method of the redistribution elements 138 may include a lithography process and a plating/deposition process. In addition, a material of the redistribution elements 138 may include Cu, Al, Ti, the like or combinations thereof.

Referring to FIG. 1 and FIG. 2O, step S128 is performed, and a second polymer layer 140 is formed. In some embodiments, the second polymer layer 140 is globally formed over the reconstructed wafer shown in FIG. 2N. As such, the redistribution elements 138, the core polymers 136, the core polymer layer 134*a* as well as the exposed first polymer layer 132 and dielectric layer 112 in the opening W2 (as shown in FIG. 2M) are covered by the second polymer layer 140. In some embodiments, a formation method of the second polymer layer 140 includes a spin coating process or a deposition process. A material of the second polymer layer 140 may be the same as the material of the first polymer layer 132, and different from the material of the core polymer layer 134*a*. In some embodiments, the first polymer layer 132 and the second polymer layer 140 are made of the same material, and have a refractive index less than a refractive index of the material of the core polymer layer 134*a*. For instance, the material of the first polymer layer 132 and the second polymer layer 140 may include siloxane-based polymers, photosensitive polymer or the like, and has a refractive index ranging from 1.5 to 1.9. On the other hand, the material of the core polymer layer 134*a* may include siloxane-based polymers, photosensitive polymer or the like, and has a refractive index ranging from 1.5 to 1.9. In addition, a thickness of the second polymer layer 140 may range from 1 μm to 10 μm. Up to here, a semiconductor package 10 is formed over the carrier CA.

Figure 3A:
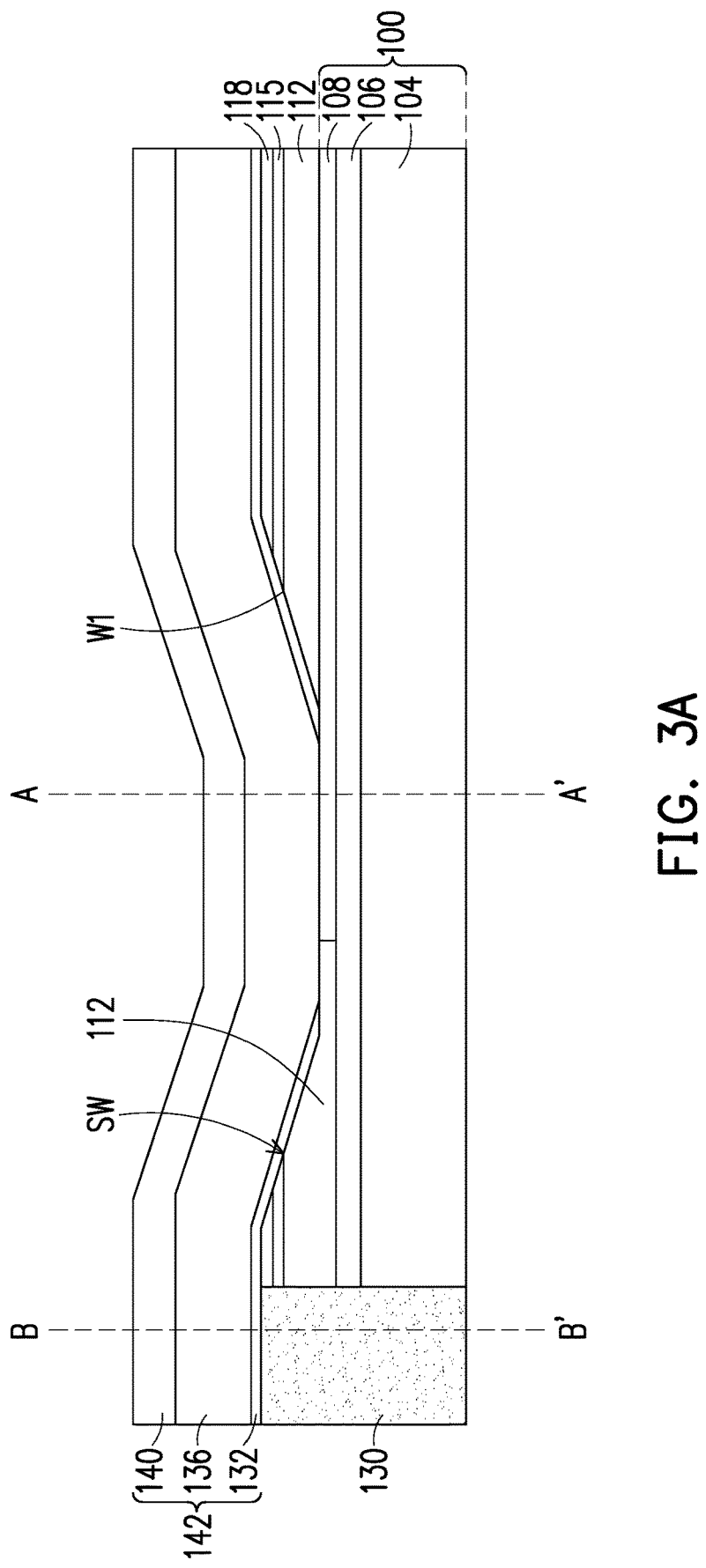
FIG. 3A is an enlarged view of a region R shown in FIG. 2O.
Figure 3C:
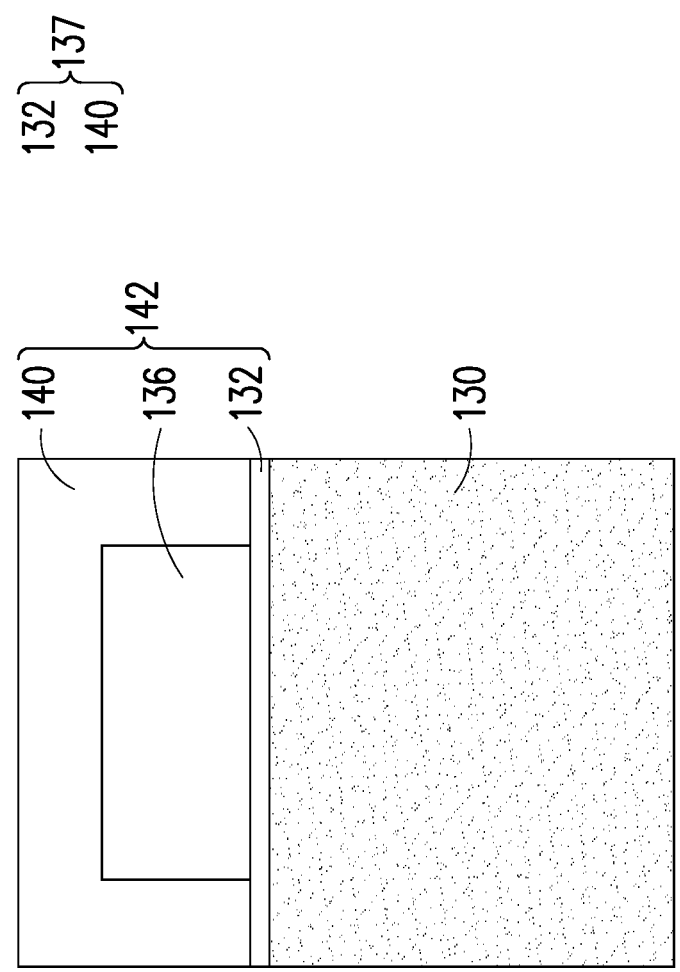
FIG. 3C is a cross-sectional view along a B-B' line illustrated in FIG. 3A.
Figure 3E:
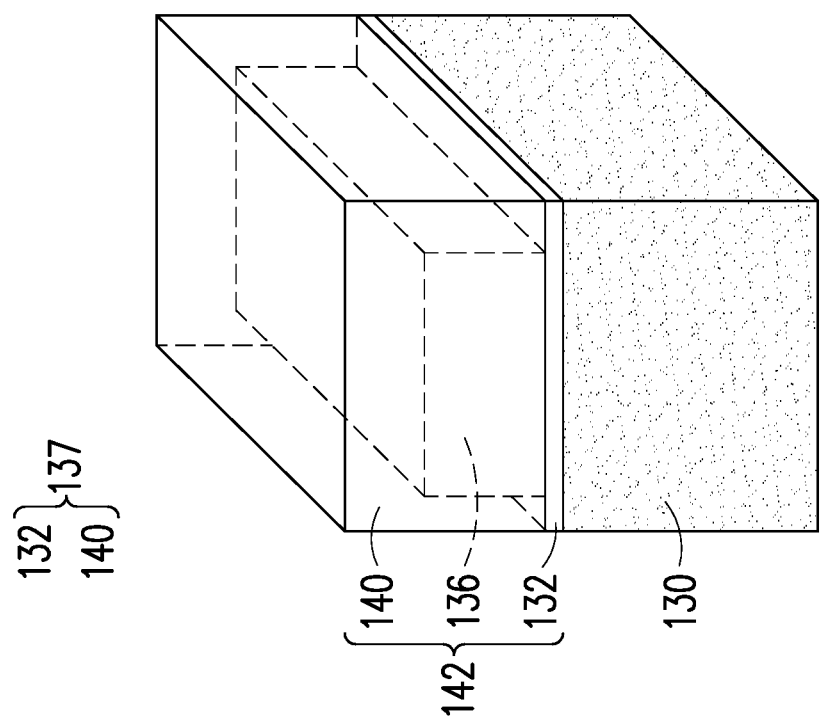
FIG. 3E is a three-dimensional view of a portion of the wave guide structure and an underlying portion of the encapsulant as shown in FIG. 3A.

FIG. 3A is an enlarged view of a region R in FIG. 2O. FIG. 3B is a cross-sectional view along an A-A' line illustrated in FIG. 3A. FIG. 3C is a cross-sectional view along a B-B' line illustrated in FIG. 3A. FIG. 3D is an exemplary top view of the wave guide structure and the underlying portion of the wave guide pattern as shown in FIG. 3A. FIG. 3E is a three-dimensional view of a portion of the wave guide structure and an underlying portion of the encapsulant as shown in FIG. 3A.

Referring to FIG. 2O and FIG. 3A, the core polymer 136, the underlying portion of the first polymer layer 132, and the overlying portion of the second polymer layer 140 are collectively referred as a wave guide structure 142. The wave guide structure 142 crosses over a portion of the encapsulant 130 located between adjacent photonic dies PD, and spans on these photonic dies PD. In some embodiments, the wave guide structure 142 overlaps with the wave guide patterns 108 of these photonic dies PD. In addition, the wave guide structure 142 further extends into the openings W1 of these photonic dies PD, so as to be optically coupled between the wave guide patterns 108 of these photonic dies PD. Therefore, the wave guide structure 142 may be functioned to realize optical communication between the wave guide patterns 108 of adjacent photonic dies PD. Viewing from another aspect, the wave guide structure 142 may be regarded as penetrating the dielectric layers 112, and may be in direct contact with the wave guide patterns 108. In some embodiments, the core polymer(s) 136 of the wave guide structure 142 may be in direct contact with the wave guide patterns 108.

Referring to FIG. 3A and FIG. 3B, within the span of the opening W1, a portion of the core polymer 136 is in contact with the wave guide pattern 108. A top surface and a sidewall of this portion of the core polymer 136 are covered by the second polymer layer 140, and a bottom surface of the core polymer 136 covers top surfaces of the wave guide pattern 108 and the dielectric layer 112. In other words, this portion of the core polymer 136 is wrapped by the second polymer layer 140, the dielectric layer 112 and the wave guide pattern 108. Since the wave guide pattern 108 is in contact with the core polymer 136, an optical signal can be successfully transmitted between the core polymer 136 and the wave guide pattern 108. In some embodiments, a refractive index of the core polymer 136 is greater than refractive indexes of the second polymer layer 140 and the dielectric layer 112, such that an optical signal loss can be effectively reduced. For instance, the core polymer 136 may have a refractive index of about 1.516. In addition, the second polymer 140 may have a refractive index of about 1.511, whereas the dielectric layer 112 may be made of silicon oxide, and has a refractive index of about 1.47.

Referring to FIG. 3A and FIG. 3C, another portion of the core polymer 136 is not in direct contact with the wave guide pattern 108, and is wrapped by the first polymer layer 132 and the second polymer layer 140. A top surface and a sidewall of this portion of the core polymer 136 are covered by the second polymer layer 140, and a bottom surface of this portion of the core polymer 136 is in contact with the first polymer layer 132. In this way, the first polymer layer 132 and the second polymer layer 140 of the wave guide structure 142 can be collectively regarded as a cladding polymer 137, and the core polymer layer 136 is surrounded by the cladding polymer 137. In some embodiments, the refractive index of the core polymer 136 is also greater than a refractive index of the first polymer layer 132. As such, the core polymer 136 with a rather high refractive index can be wrapped by materials having a rather low refractive index, and an optical signal loss can be effectively reduced. For instance, the core polymer 136 may have a refractive index of about 1.516, whereas the first polymer 132 may have a refractive index of about 1.511

Referring to FIG. 3A and FIG. 3D, in some embodiments where the wave guide pattern 108 is tapered from the wide end 108b toward the narrow end 108a, substantially the whole wave guide pattern 108 from the narrow end 108a to the wide end 108b is covered by the wave guide structure 142. As shown in FIG. 3D, the wide end 108b of the wave guide pattern 108 may be connected to one of the optical devices 110, so as to be functioned as an optical transmission input/output of the optical device 110. In some embodiments, the optical device 110 connected with the wave guide pattern 108 is also covered by the wave guide structure 142. In addition, in some embodiments, a ratio of the width WD1 of the narrow end 108a of the wave guide pattern 108 with respect to a width WD4 of the wave guide structure 142 (measured between opposite sidewalls of the second polymer layer 140 across the wave guide pattern 108) ranges from 0.1 to 0.9.

Referring to FIG. 3A and FIG. 3E, the illustrated portion of the wave guide structure 142 is located over a portion of the encapsulant 130 between adjacent photonic dies PD. It is clearly revealed that the core polymer 136 is wrapped by the cladding polymer 137 including the first polymer layer 132 and the second polymer layer 140.

As above, the wave guide structure 142 is formed on a reconstructed wafer structure, in which the photonic dies PD are laterally encapsulated by the encapsulant 130. The wave guide structure 142 is connected between adjacent photonic dies PD, and is functioned to realize optical communication between these adjacent photonic dies PD. In addition, the separated photonic dies PD and the wave guide structure 142 are integrated in a single package structure (i.e., the semiconductor package 10). Since the wave guide structure 142 extends over the reconstructed wafer structure, optical transmission between the photonic dies PD is no longer limited by configuration (e.g. spacing) of the unsingulated photonic dies within a semiconductor wafer. In some embodiments, the wave guide structure 142 is further integrated with redistribution structures (e.g., the redistribution elements 138) formed on the reconstructed wafer structure, and can be applied in a fan-out semiconductor package.

Figure 4:
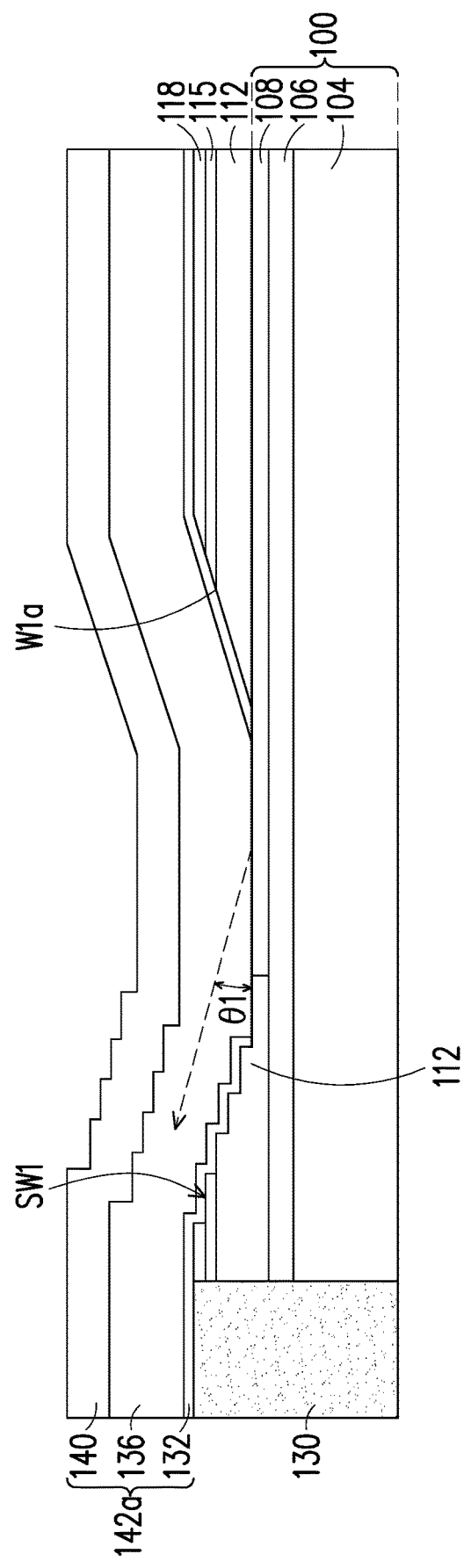
FIG. 4 is a cross-sectional view illustrating a wave guide structure and elements around the wave guide structure according to some embodiments of the present disclosure.

FIG. 4 is a cross-sectional view illustrating a wave guide structure 142a and elements around the wave guide structure 142a according to some embodiments of the present disclosure. The embodiments described with reference to FIG. 4 are similar to the embodiments described with reference to FIG. 2A through FIG. 2O and FIG. 3A through FIG. 3E. Only the differences therebetween will be discussed, the like or the same part will not be repeated again. In addition, the like numeral references indicate the like elements.

Referring to FIG. 4, in some embodiments, an opening W1a exposing the wave guide pattern 108 of the photonic die PD has a stepped sidewall SW1. In some embodiments, the opening W1a penetrates through the passivation layer 118 and the passivation layer 115, and extends into the dielectric layer 112. In these embodiments, a stack of the passivation layer 118, the passivation layer 115 and the dielectric layer 112 are shaped to have a plurality of steps. Each step is recessed backward with respect to the underlying step from a center of the opening W1a. In some embodiments, the stepped sidewall SW1 of the opening W1a has 1 to 8 steps. The wave guide structure 142a conformally extends across the opening W1a, such that a climbing portion of the wave guide structure 142a extending along the stepped sidewall SW1 of the opening W1a has a stepped shape as well. That is, the first polymer layer 132, the core polymer 136 and the second polymer layer 140 of this climbing portion of the wave guide structure 142a may respectively have a stepped top surface. In some embodiments, as shown in FIG. 4, a portion of the sidewall of the opening W1a close to an edge of the photonic die PD has the stepped shape, whereas another portion of the sidewall of the opening W1a away from the edge of the photonic die PD has a tilt surface. In alternative embodiments, substantially the whole portion of the sidewall of the opening W1a has the stepped shape. In some embodiments, a formation method of the opening W1a includes a photolithography processes, multiple trimming processes (on photoresist) and multiple etching processes. A combination of the photolithography process and an etching process or each combination of the trimming process and an etching process is performed to form a single step.

By forming the opening W1a with the stepped sidewall SW1, a gradient of the climbing portion of the wave guide structure 142a may be easily lowered. Therefore, an angle θ1 between the climbing portion of the wave guide structure 142a and flat portions of the wave guide structure 142a (e.g., the portion of the wave guide structure 142a lying outside the span of the opening W1a) can be decreased. Accordingly, optical signal loss at the joint of the climbing portion and the flat portions of the wave guide structure 142a may be effectively reduced.

Figure 5:
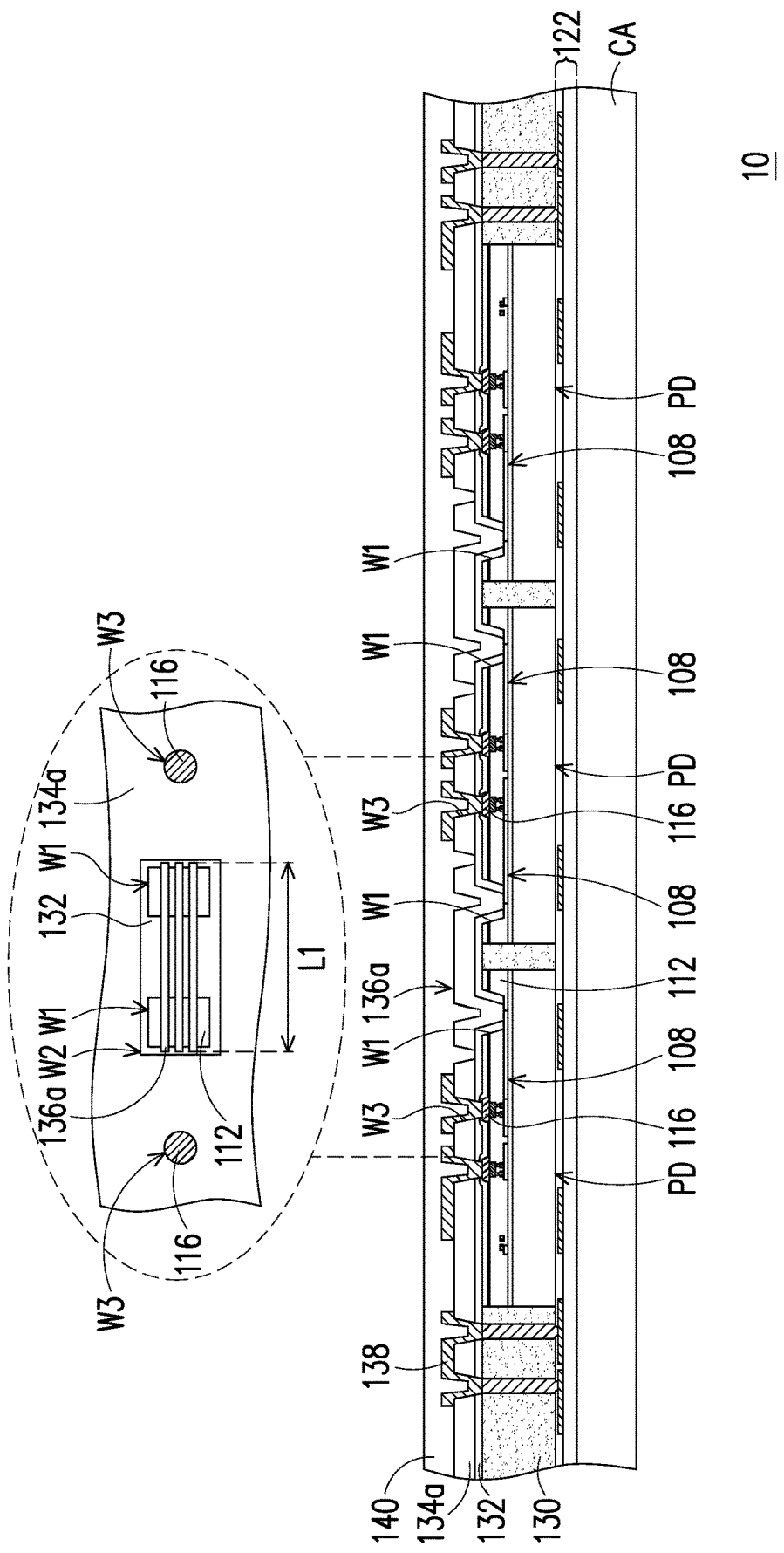
FIG. 5 is a cross-sectional view illustrating a wave guide structure according to alternative embodiments of the present disclosure.

FIG. 5 is a cross-sectional view illustrating a wave guide structure according to alternative embodiments of the present disclosure. The embodiments described with reference to FIG. 5 are similar to the embodiments described with reference to FIG. 2A through FIG. 2O and FIG. 3A through FIG. 3E. Only the differences therebetween will be discussed, the like or the same part will not be repeated again. In addition, the like numeral references indicate the like elements.

Referring to FIG. 5, in some embodiments, the core polymer 136a, which is a portion of the patterned core polymer layer 134a, is not connected with other portions of the core polymer layer 134a. The area enclosed by a dash line in FIG. 5 shows an exemplary top view of the core polymers 136a and other portions of the core polymer layer 134a. As shown in this exemplary top view, during the patterning operation performed on the core polymer layer 134 described with reference to FIG. 2M, the core polymers 136a are not connected to the portions of the core polymer layer 134a at opposite sides of the opening W2, and terminals of the core polymers 136a are located within the span of the opening W2. Thereby, the length L1 of the core polymer 136a is less than the length of the opening W2 along the same direction. As shown in the cross-sectional view, the second polymer layer 140 is filled between the core polymers 136a and the core polymer layer 134a.

FIG. 6A through FIG. 6E are cross-sectional views illustrating structures at various stages during a manufacturing method for integrating the semiconductor package 10 with electronic dies according to some embodiments of the present disclosure.

Figure 6A:
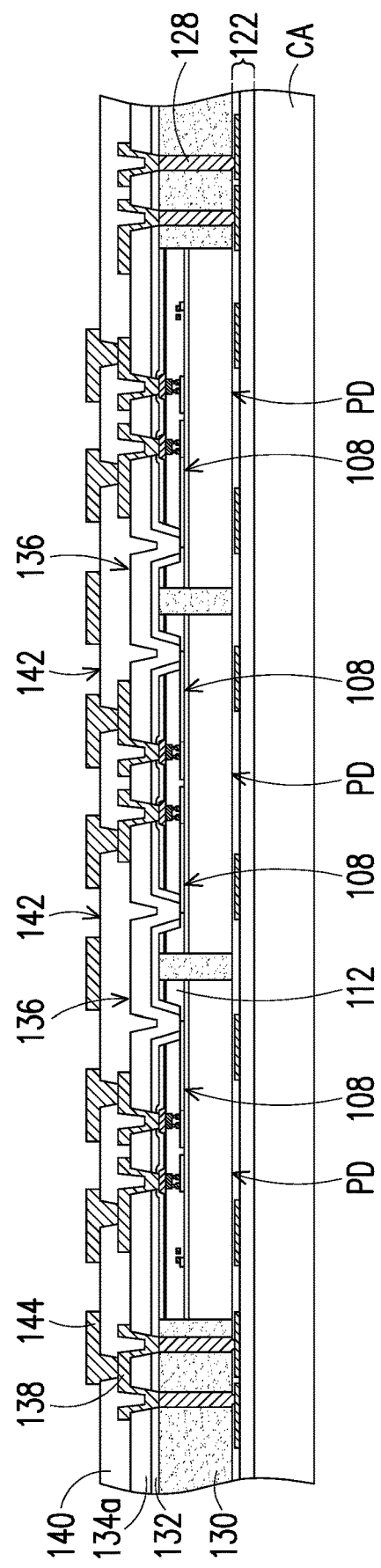
FIG. 6A through FIG. 6E are cross-sectional views illustrating structures at various stages during a manufacturing method for integrating the semiconductor package with electronic dies according to some embodiments of the present disclosure.

Referring to FIG. 2O and FIG. 6A, the second polymer layer 140 is patterned to expose the redistribution elements 138. In addition, redistribution elements 144 are formed over the patterned second polymer layer 140. The redistribution elements 144 are electrically connected with the exposed redistribution elements 138. The redistribution elements 144 may respectively include a conductive via, a conductive trace or a combination thereof. In some embodiments, the redistribution elements 144 may be regarded as fan-out redistribution structures, and the redistribution elements 138 are further out-routed by the redistribution elements 144. In some embodiments, the redistribution elements 144 are distributed over the photonic dies PD and the encapsulant 130. The redistribution elements 144 may or may not be overlapped with the core polymer layer 136, whereas the underlying redistribution elements 138 may not be overlapped with the core polymer layer 136. A formation method of the redistribution elements 144 may include a photolithography process and a plating/deposition process. A material of the redistribution elements 144 may include Cu, Al, Ti, the like or combinations thereof. In some embodiments, additional redistribution layer(s) (not shown) containing polymer layer(s) and redistribution elements may be further formed over the second polymer layer 140.

Figure 6B:
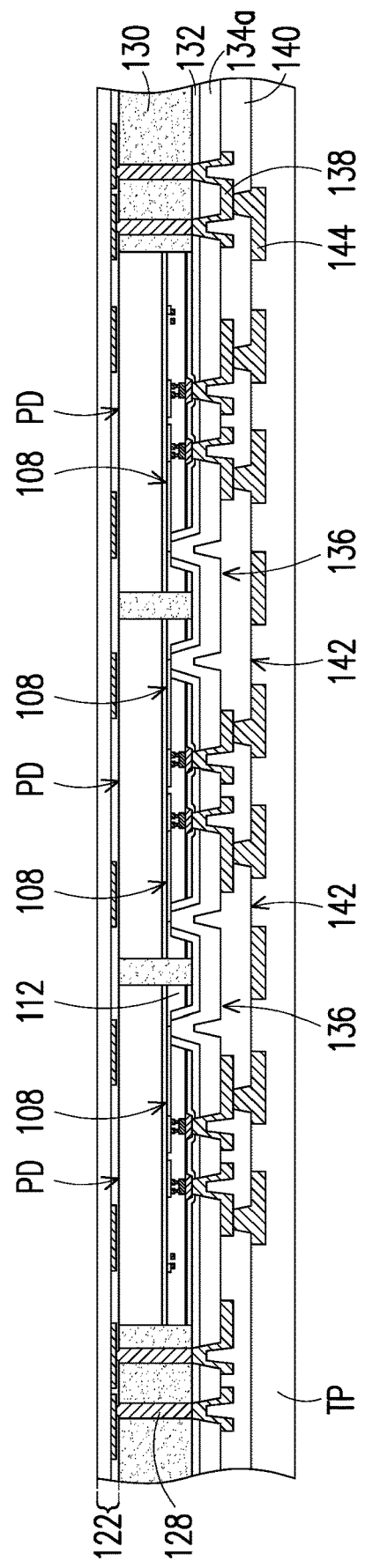

Referring to FIG. 6A and FIG. 6B, the package structure shown in FIG. 5A is flipped over, and the surfaces of the second polymer layer 140 and redistribution elements 144 are attached to a tape TP. In some embodiments, the tape TP is attached to a frame (not shown). In addition, the carrier CA is detached from the photonic dies PD and the encapsulant 130. In those embodiments of which the redistribution structure 122 has been formed on the carrier CA in an earlier step, the carrier CA is now detached from the redistribution structure 122. After the carrier CA is detached, a surface of the redistribution structure 122 opposite to the photonic dies PD is exposed. In some embodiments, an adhesion layer such as a LTHC layer or a thermal release layer is preformed on the carrier CA, and the carrier CA with the adhesion layer is detached as the adhesion layer loses its adhesive property when exposed to light or heat.

Figure 6C:
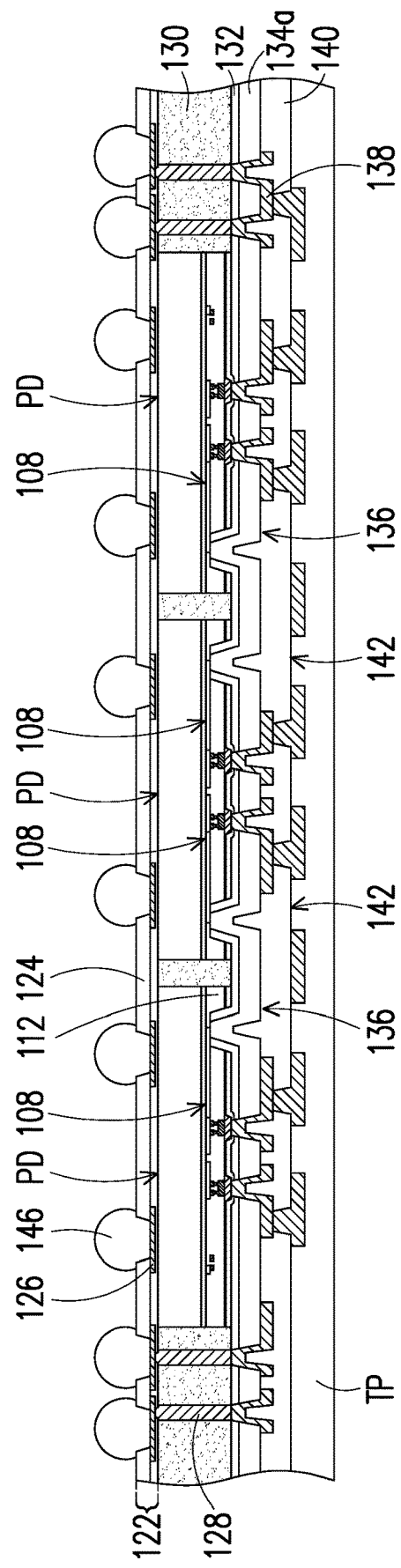

Referring to FIG. 6B and FIG. 6C, the dielectric layer(s) 124 of the redistribution structure 122 are patterned, so as to form openings exposing at least some of the interconnections 126 in the redistribution structure 122. Thereafter, electrical connectors 146 are respectively formed in these openings, and are electrically connected with the exposed interconnections 126. In some embodiments, the electrical connectors 146 include micro-bumps, controlled collapse chip connection (C4) bumps, ball grid array (BGA) balls, solder balls or the like. For instance, a dimension of the micro-bump described in the present disclosure may range from 5 µm to 50 µm. In some embodiments, before forming the electrical connectors 146, an under bump metallization (UBM) layer (not shown) may be formed in those openings of the dielectric layer(s) 124.

Figure 6D:
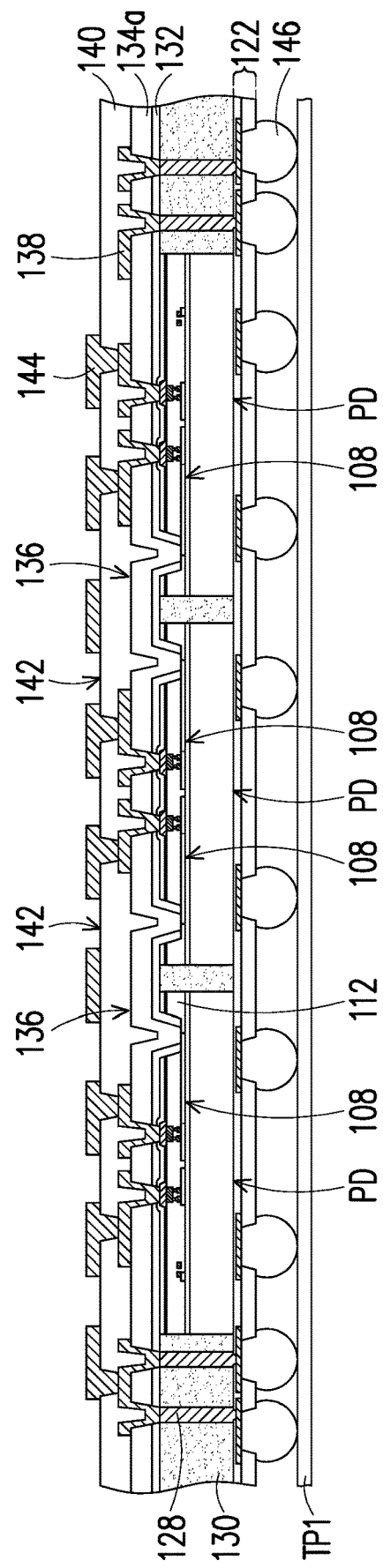

Referring to FIG. 6C and FIG. 6D, the package structure shown in FIG. 6C is flipped over, and the electrical connectors 146 are attached to a tape TP1. In some embodiments, the tape TP1 is attached to a frame (not shown). In addition, the tape TP shown in FIG. 6C is now detached from the current structure. As such, the surfaces of the second polymer layer 140 and the redistribution elements 144 are exposed.

Figure 6E:
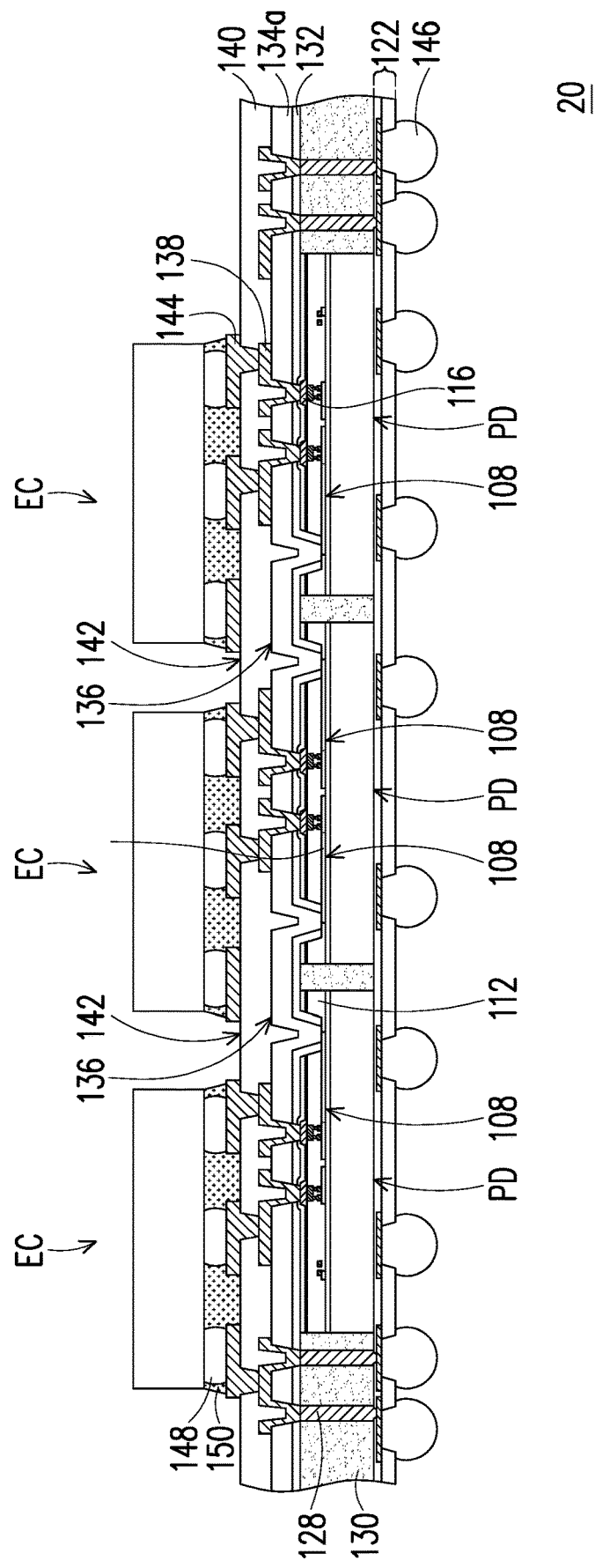

Referring to FIG. 6D and FIG. 6E, electronic components EC are attached onto the exposed surfaces of the package structure shown in FIG. 6D. In some embodiments, the electronic component EC is a single electronic die, such as a logic integrated circuit (IC) die, a memory die, an analog IC die, an application-specific IC (ASIC) die or the like. In other embodiments, the electronic component EC is a package structure of which a plurality of the electronic dies are encapsulated in an encapsulant (not shown). The electronic components EC are attached onto the exposed surfaces of the redistribution elements 144, and are electrically connected to the redistribution elements 144. In some embodiments, the electronic components EC are electrically connected to the redistribution elements 144 through electrical connectors 148. For instance, the electrical connectors 148 may include micro-bumps or C4 bumps. In addition, an underfill 150 is filled in a space between the electronic component EC and the underlying package structure. As such, the electrical connectors 148 are laterally surrounded by the underfill 150. Since at least some of the redistribution elements 144 are electrically connected to the photonic dies PD through, for example, the redistribution elements 138 and the conductive pads 116, the electronic components EC and the photonic dies PD may be electrically connected. In some embodiments, the electronic components EC are partially overlapped with the underlying photonic dies PD. In other embodiments, the electronic components EC are completely overlapped with the photonic dies PD. Those skilled in the art may adjust the dimensions and arrangement of the electronic components EC and the photonic dies PD, the present disclosure is not limited thereto.

After attaching the electronic components EC, the tape TP1 shown in FIG. 6D may be removed, and a dicing process may be performed on a peripheral region of the wafer structure that is partially shown in FIG. 6E. Up to here, a semiconductor package 20 is formed. The photonic dies PD and the electronic components EC are integrated within the semiconductor package 20. It should be noted that the wave guide structures 142 optically coupled between adjacent photonic dies PD are integrated with redistribution elements (e.g., the redistribution elements 138 and 144), and are located between the photonic dies PD and the electronic components EC.

Figure 7:
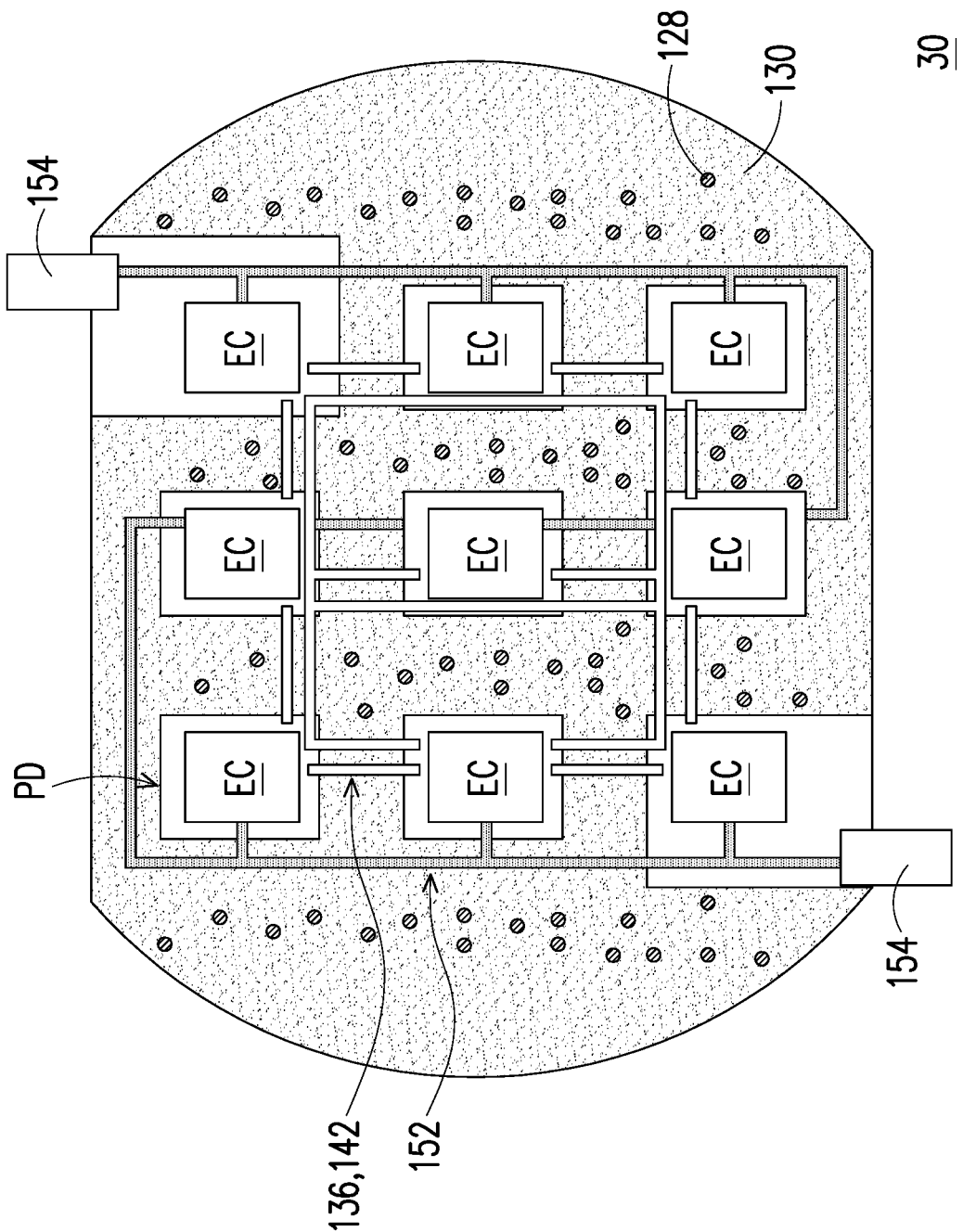
FIG. 7 is an exemplary top view of a semiconductor package according to some embodiments of the present disclosure.

FIG. 7 is an exemplary top view of a semiconductor package 30 according to some embodiments of the present disclosure. The semiconductor package 30 shown in FIG. 7 is similar to the semiconductor package 20 as shown in FIG. 6E. Only the differences therebetween will be discussed, the like or the same parts will not be repeated again.

Referring to FIG. 6E and FIG. 7, the semiconductor package 30 includes a plurality of the photonic dies PD and a plurality of the electronic components EC. The photonic dies PD are spaced apart, and laterally surrounded by the encapsulant 130. In some embodiments, the photonic dies PD are arranged as an array. For instance, the photonic dies PD are arranged along three columns and three rows, but the present disclosure is not limited thereto. In addition, a plurality of the conductive pillars 128 may be disposed in the encapsulant 130. The electronic components EC are respectively attached onto the photonic dies PD, as similar to the illustration shown in FIG. 5E. As shown in FIG. 7, in some embodiments, the dimensions of the electronic components EC are smaller than the dimensions of the photonic dies PD, and the electronic components EC may be completely overlapped with the underlying photonic dies PD. The wave guide structures 142, which respectively include the core polymer 136, the underlying portion of the first polymer layer 132 and the overlying portion of the second polymer layer 140, are connected between the photonic dies PD, so as to be functioned as data wave guides. In some embodiments, the semiconductor package 30 further includes power wave guides 152, which connect stacks of the photonic dies PD and electronic components EC with optical fibers 154.

Similar to the wave guide structure 142, the power wave guide 152 may include a core polymer and a cladding polymer layer (both not shown) wrapping the core polymer.

Figure 8:
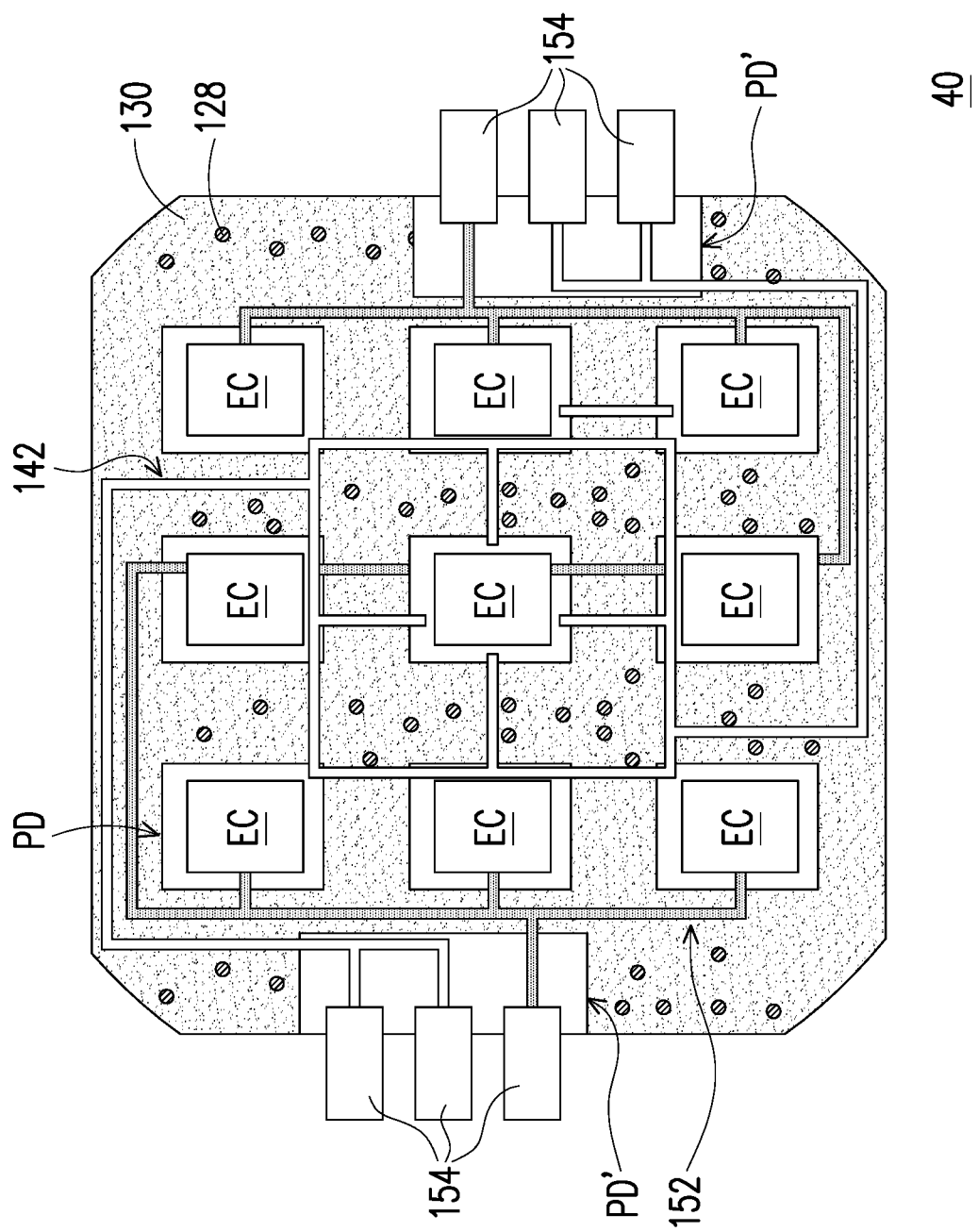
FIG. 8 is an exemplary top view of a semiconductor package 40 according to some embodiments of the present disclosure.

FIG. 8 is an exemplary top view of a semiconductor package 40 according to some embodiments of the present disclosure. The semiconductor package 40 shown in FIG. 8 is similar to the semiconductor package 30 as shown in FIG. 7. Only the differences therebetween will be discussed, the like or the same parts will not be repeated again.

Referring to FIG. 7 and FIG. 8, the semiconductor package 40 shown in FIG. 8 further includes at least one additional photonic die PD'. In some embodiments, as shown in FIG. 8, the semiconductor package 40 includes two of the additional photonic dies PD'. In alternative embodiments the semiconductor package 40 may include a single additional photonic die PD' or more than three additional photonic dies PD'. The present disclosure is not limited to the amount of the additional photonic die PD'. The additional photonic die PD' is disposed outside an array of die stacks. The die stacks respectively include one of the photonic dies PD and one of the electric components EC lying above. The additional photonic die PD' is structurally similar to the photonic die PD, and is connected to the photonic dies PD through the power wave guides 152 and the data wave guides (i.e., the wave guide structures 142). In some embodiments, the additional photonic die PD' is connected to a plurality of the optical fibers 154. Some of the optical fibers 154 are connected to the power wave guides 152, so as to be functioned as optical power input(s)/output(s) for transmitting optical power between the semiconductor package 40 and an external system (not shown). On the other hand, others of the optical fibers 154 are connected to the data wave guides (i.e., the wave guide structures 142), so as to be functioned as optical signal input(s)/output(s) for transmitting optical signals between the semiconductor package 40 and an external system (not shown). For instance, one of the optical fibers 154 connected to each additional photonic die PD' is connected to the power wave guides 152, whereas two of the optical fibers 154 connected to each additional photonic die PD' are connected to the data wave guides (i.e., the wave guide structures 142). However, those skilled in the art may adjust the amount of the optical signal input/output and the amount of the optical power input/output according to design requirements, the present disclosure is not limited thereto. In some embodiments, the additional photonic die PD' is disposed at an edge region of the semiconductor package 40, and are laterally encapsulated by the encapsulant 130, in which the conductive pillars 128 are disposed. In these embodiments, a sidewall of the additional photonic die PD' may be substantially coplanar with a boundary of the semiconductor package 40. As shown in FIG. 8, The semiconductor package 40 is in a wafer form, and size and/or shape of the semiconductor package 40 are similar to those of a semiconductor wafer. Alternatively, the semiconductor package 40 may be singulated into a package form having a dimension much less than that of a semiconductor wafer and a shape probably different from that of a semiconductor wafer. Moreover, in some embodiments, an area of each additional photonic die PD' is greater than an area of each photonic die PD, in order to provide sufficient landing area of the optical fibers 154. However, those skilled in the art may adjust the area of the photonic dies PD and the additional photonic dies PD', the present disclosure is not limited thereto.

Figure 9A:
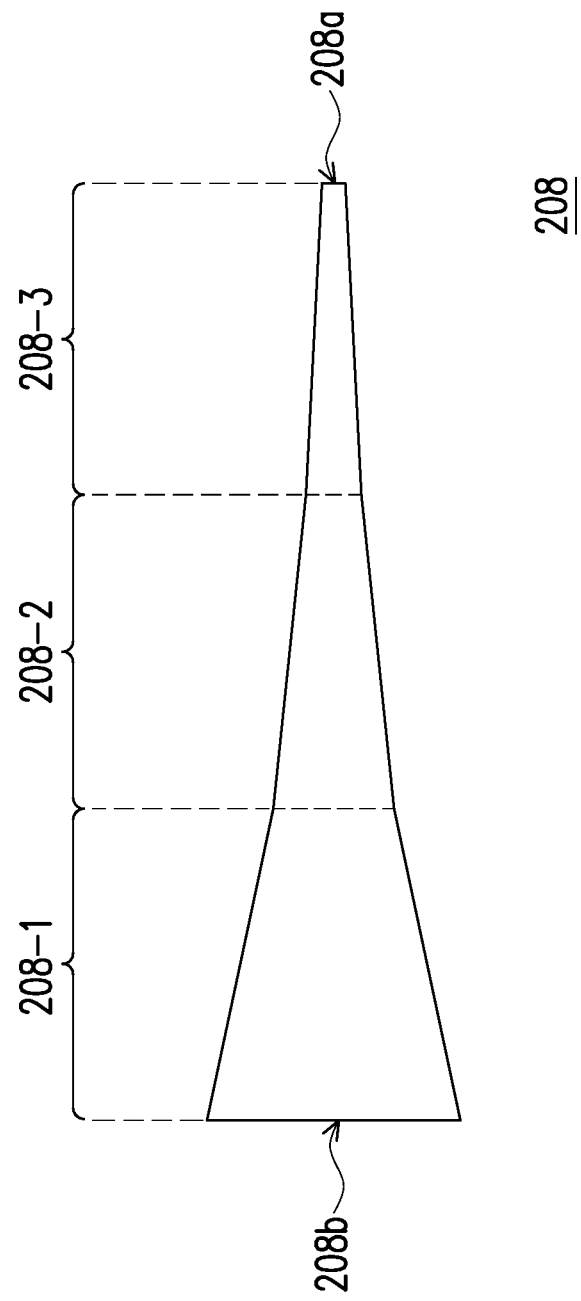
FIG. 9A and FIG. 9B are exemplary top views of wave guide patterns according to some embodiments of the present disclosure.
Figure 9B:
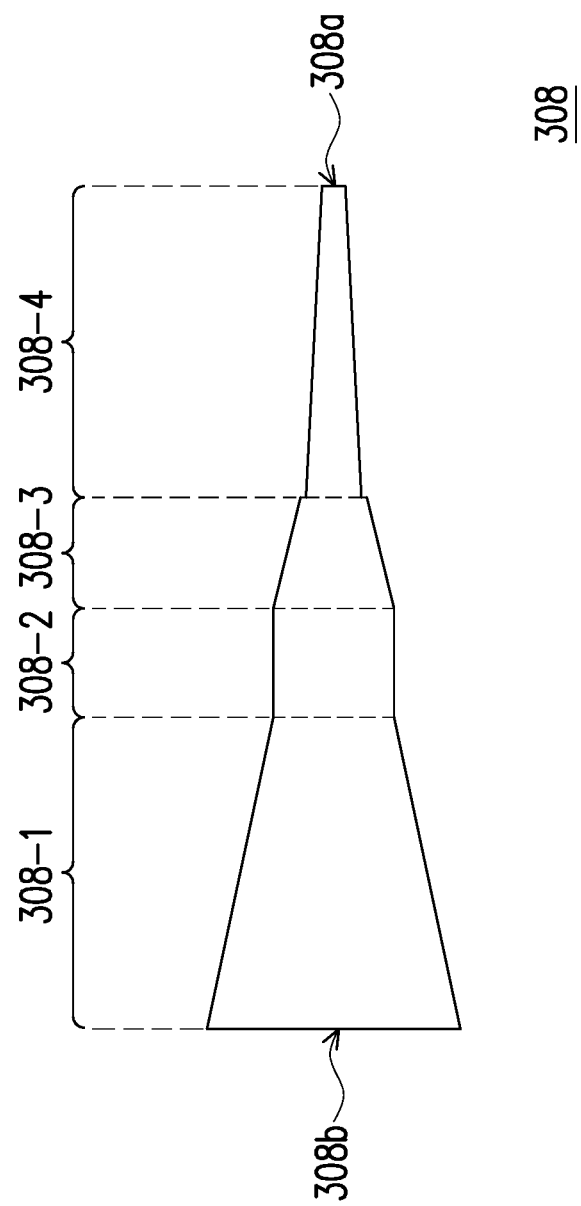

FIG. 9A and FIG. 9B are exemplary top views of wave guide patterns according to some embodiments of the present disclosure.

Referring to FIG. 2B and FIG. 9A, the wave guide pattern 208 shown in FIG. 9A is similar to the wave guide pattern 108 shown in FIG. 2B, and has a narrow end 208a and a wide end 208b. The difference between the wave guide pattern 108 and the wave guide pattern 208 lies in that the width of the wave guide pattern 108 shown in FIG. 2B decreases from the wide end 108b to the narrow end 108a at a constant reduction rate, whereas a width of the wave guide pattern 208 shown in FIG. 9A decreases from the wide end 208b to the narrow end 208a by multiple reduction rates. As shown in FIG. 9A, the wave guide pattern 208 may be regarded as having multiple regions, and width reduction rates of these regions are different from one another. For instance, the wave guide pattern 208 has 3 regions 208-1, 208-2 and 208-3, which are sequentially arranged from the wide end 208b to the narrow end 208a. A width reduction rate of the region 208-1 is greater than a width reduction rate of the region 208-2, and the width reduction rate of the region 208-2 is greater than a width reduction rate of the region 208-3.

Referring to FIG. 9A and FIG. 9B, the wave guide pattern 308 shown in FIG. 9B is similar to the wave guide pattern 208 as shown in FIG. 9A, except the wave guide pattern 308 has 4 regions 308-1, 308-2, 308-3 and 308-4. The regions 308-1, 308-2, 308-3 and 308-4 are sequentially arranged from a wide end 308b to a narrow end 308a of the wave guide pattern 308. Width reduction rates of at least two of the regions 308-1, 308-2, 308-3 and 308-4 are substantially equal to each other. For instance, the regions 308-1 and 308-3 may have substantially the same width reduction rate. In addition, at least one of the 308-1, 308-2, 308-3 and 308-4 may have a zero width reduction rate. For instance, a width of the region 308-2 is constant along the extending direction of the wave guide pattern 308. Moreover, the width of the wave guide pattern 308 may not be continuous at an interface between the regions 308-3 and 308-4. Instead, a width drop may be observed at the interface between the regions 308-3 and 308-4.

However, those skilled in the art may modify the shape of the wave guide pattern according to process requirements, such that the wave guide pattern could have less than 3 regions or more than 4 regions that have identical or different width reduction rates.

Figure 10A:
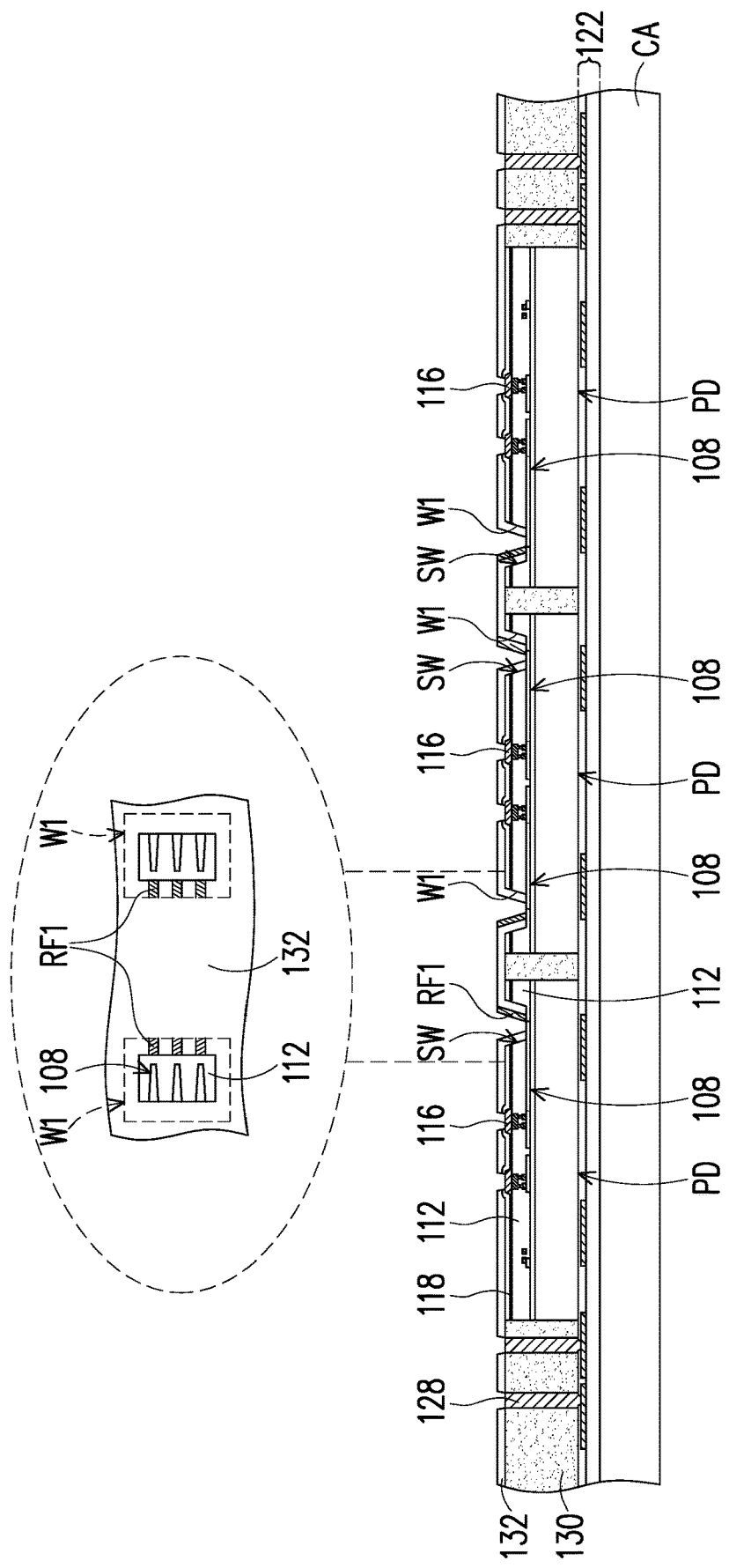
FIG. 10A through FIG. 10C are cross-sectional views illustrating structures at various stages during a manufacturing method of a semiconductor package according to some embodiments in the present disclosure.
Figure 10B:
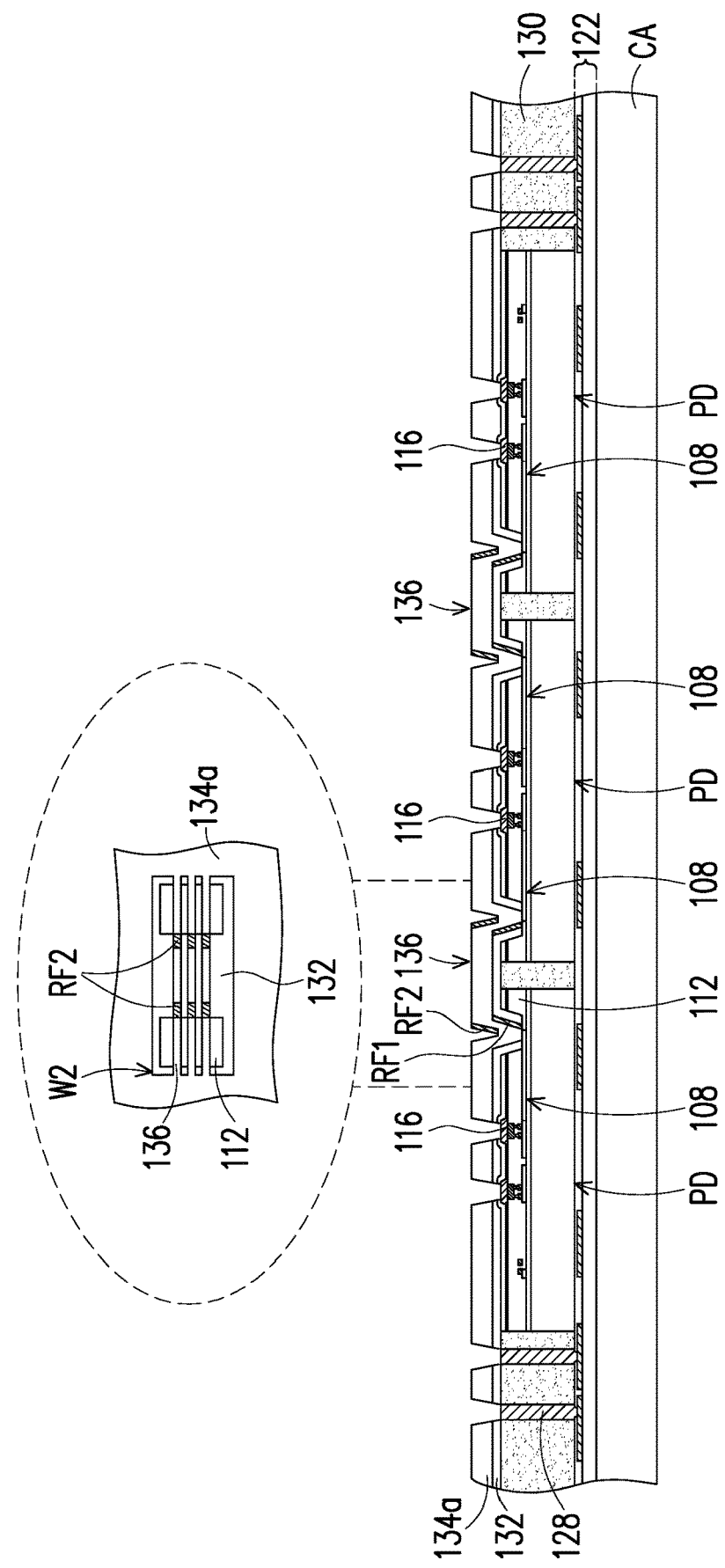
Figure 10C:
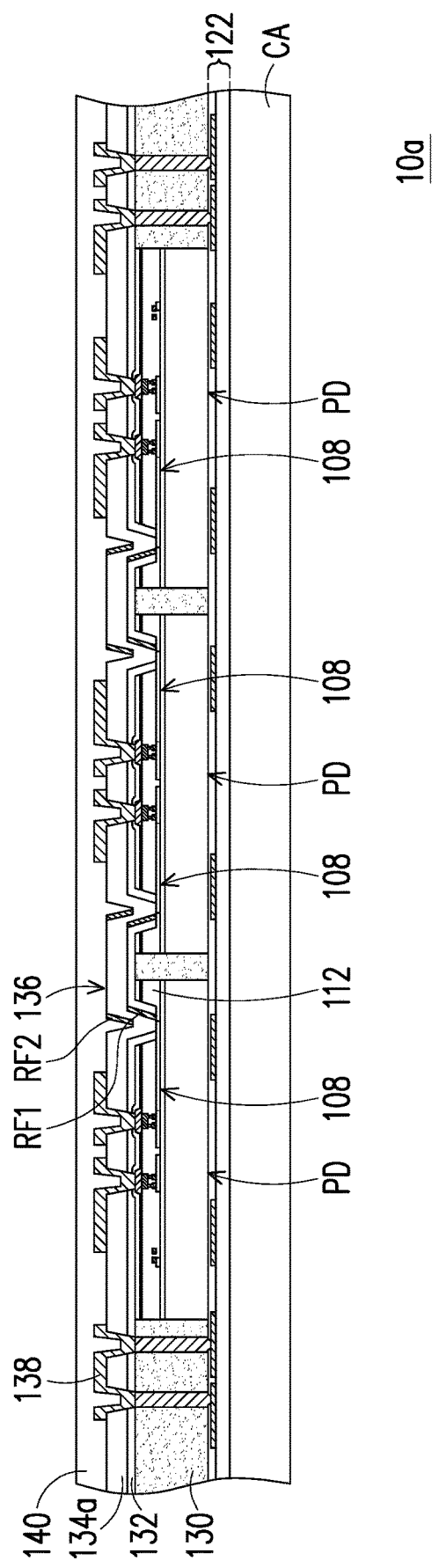

FIG. 10A through FIG. 10C are cross-sectional views illustrating structures at various stages during a manufacturing method of a semiconductor package 10a according to some embodiments in the present disclosure. The embodiments described with reference to FIG. 10A through FIG. 10C are similar to the embodiments described with reference to FIG. 2A through FIG. 2O and FIG. 3A through FIG. 3E. Only the differences therebetween will be discussed, the like or the same part will not be repeated again. In addition, the like numeral references indicate the like elements.

Referring to FIG. 2K and FIG. 10A, in some embodiments, first reflective structures RF1 are formed after patterning the first polymer layer 132 (as shown in FIG. 2K). The first reflective structures RF1 are formed in the openings W1, and respectively cover a portion of the first polymer layer 132. In one of the openings W1, the first reflective structures RF1 are disposed over a portion of the sidewall SW that is close to an edge of the photonic die PD, and are respectively located between one of the wave guide patterns 108 and the edge of the photonic die PD. The area enclosed by a dash line in FIG. 10A shows an exemplary top view of the elements in the openings W1 of adjacent photonic dies PD. As shown in this exemplary top view, the first reflective structures RF1 are located on the extending directions of the wave guide patterns 108, and are laterally separated from the wave guide patterns 108 by some portions of the dielectric layer 112. In addition, the first reflective structures RF1 formed on adjacent photonic dies PD are facing each other, respectively. The first reflective structures RF1 may be made of a reflective material, such as copper, aluminum, the like or combinations thereof. A method for forming the first reflective structures RF1 may include a deposition process (e.g., a physical vapor deposition process) or a plating process (e.g., an electroplating process or an electroless plating process), as well as a patterning process including a lithography process and an etching process.

Referring to FIG. 2M and FIG. 10B, in some embodiments, second reflective structures RF2 may be formed after the formation of the core polymers 136 (as shown in FIG. 2M). The second reflective structures RF2 respectively cover a portion of one of the core polymers 136, and are respectively overlapped with one of the first reflective structures RF1 lying under the core polymer 136. The area enclosed by a dash line in FIG. 10B shows an exemplary top view of the elements in the opening W2 of adjacent photonic dies PD. As shown in this exemplary top view, the second reflective structures RF2 respectively cover a portion of one of the core polymers 136 extending across the opening W2. In addition, the second reflective structures RF2 formed on adjacent photonic dies PD are facing each other, respectively. The second reflective structures RF2 may be made of a reflective material, such as copper, aluminum, the like or combinations thereof. A method for forming the second reflective structures RF2 may include a deposition process (e.g., a physical vapor deposition process) or a plating process (e.g., an electroplating process or an electroless plating process), as well as a patterning process including a lithography process and an etching process.

Referring to FIG. 2N, FIG. 2O and FIG. 10C, in some embodiments, steps of forming the redistribution elements 138 and the second polymer layer 140 are performed after forming the second reflective structures RF2, so as to form the semiconductor package 10a. In alternative embodiments, the steps of forming the redistribution elements 138 precedes the step of forming the second reflective structure RF2. The present disclosure is not limited to the sequential order of the steps of forming the second reflective structures RF2 and the redistribution elements 138. The semiconductor package 10a is similar to the semiconductor package 10 as shown in FIG. 2O, except that the semiconductor package 10a further includes the first reflective structures RF1 and the second reflective structures RF2. By disposing the first reflective structures RF1 and the second reflective structures RF2 at opposite sides of some climbing sections of the core polymers 136, light signal transmitted through these climbing sections of the core polymers 136 are better confined in the core polymers 136. As a result, signal loss of the wave guide structures 142 can be reduced.

As above, the wave guide structure of the embodiments in the present disclosure is formed on a reconstructed wafer structure, in which the photonic dies are laterally encapsulated by the encapsulant. The wave guide structure is connected between adjacent photonic dies, and is functioned to realize optical communication between these adjacent photonic dies. In addition, the separated photonic dies and the wave guide structure are integrated in a single package structure. Since the wave guide structure extends over the reconstructed wafer structure, optical transmission between the photonic dies is no longer limited by configuration (e.g. spacing) of unsingulated photonic dies within a semiconductor wafer. In some embodiments, the wave guide structure is further integrated in redistribution layers formed on the reconstructed wafer structure, and may be applied in a fan-out semiconductor package.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a semiconductor package is provided. The semiconductor package comprises: a photonic die, an encapsulant and a wave guide structure. The photonic die comprises: a substrate, having a wave guide pattern formed within a peripheral region of a front surface of the substrate; and a dielectric layer, covering the front surface of the substrate, and having an opening overlapped with an end portion of the wave guide pattern. The encapsulant laterally encapsulates the photonic die. The wave guide structure lies on the encapsulant and the photonic die, and extends into the opening of the dielectric layer, to be optically coupled to the wave guide pattern. The wave guide structure comprises: a first polymer layer, lying on top surfaces of the encapsulant and the dielectric layer, and further covering a sidewall of the opening of the dielectric layer; a core polymer, covering the end portion of the wave guide pattern overlapped with the opening of the dielectric layer, and climbing onto the top surface of the dielectric layer and the encapsulant along a top surface of the first polymer layer; and a second polymer layer, covering a sidewall and a top surface of the core polymer layer.

In another aspect of the present disclosure, a semiconductor package is provided. The semiconductor package comprises: a photonic die, an encapsulant and a wave guide structure. The photonic die comprises: a substrate, having a wave guide pattern at a front surface of the substrate; and a dielectric layer, covering the front surface of the substrate, and having an opening overlapped with an end portion of the wave guide pattern. The encapsulant laterally encapsulates the photonic die. The wave guide structure lies on the encapsulant and the photonic die, and extends into the opening of the dielectric layer, to be optically coupled to the wave guide pattern. The wave guide structure comprises: a first polymer layer, lying on top surfaces of the encapsulant and the dielectric layer, and further covering a sidewall of the opening of the dielectric layer; a first reflective pattern, covering a portion of the first polymer layer extending along the sidewall of the opening of the dielectric layer; a core polymer, covering the end portion of the wave guide pattern, and climbing onto the top surfaces of the dielectric layer and the encapsulant along top surfaces of the first reflective pattern and the first polymer layer; a second reflective pattern, covering a portion of the core polymer extending along the top surface of the first reflective structure; and a second polymer layer, covering the second reflective pattern and the core polymer.

In yet another aspect of the present disclosure, a semiconductor package is provided. The semiconductor package comprises: photonic dies, an encapsulant and wave guide structures. The photonic dies respectively comprise: a substrate, having a wave guide pattern formed within a peripheral region of a front surface of the substrate; and a dielectric layer, covering the front surface of the substrate, and having an opening overlapped with an end portion of the wave guide pattern. The encapsulant laterally encapsulates the photonic dies. The wave guide structures respectively bridge the end portion of the wave guide pattern from one of the photonic dies to the end portion of the wave guide pattern from an adjacent one of the photonic dies across a portion of the encapsulant in between the adjacent ones of the photonic dies. The wave guide structures respectively comprise a core polymer and a cladding polymer wrapping around the core polymer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a photonic die, comprising:
   a substrate, having a wave guide pattern formed within a peripheral region of a front surface of the substrate; and
   a dielectric layer, covering the front surface of the substrate, and having an opening overlapped with an end portion of the wave guide pattern;
   an encapsulant, laterally encapsulating the photonic die; and
   a wave guide structure, lying on the encapsulant and the photonic die, and extending into the opening of the dielectric layer, to be optically coupled to the wave guide pattern, wherein the wave guide structure comprises:
   a first polymer layer, lying on top surfaces of the encapsulant and the dielectric layer, and further covering a sidewall of the opening of the dielectric layer;
   a core polymer, covering the end portion of the wave guide pattern overlapped with the opening of the dielectric layer, and climbing onto the top surface of the dielectric layer and the encapsulant along a top surface of the first polymer layer; and
   a second polymer layer, covering a sidewall and a top surface of the core polymer layer.

2. The semiconductor package according to claim 1, wherein a first portion of the core polymer extending into the opening of the dielectric layer is in contact with the wave guide pattern without the first polymer layer in between.

3. The semiconductor package according to claim 2, wherein the dielectric layer further laterally surrounds the wave guide pattern, and a bottom surface of the first portion of the core polymer is in contact with the wave guide pattern and the dielectric layer.

4. The semiconductor package according to claim 1, wherein a second portion of the core polymer lies on the first polymer layer.

5. The semiconductor package according to claim 4, wherein the second portion of the core polymer is fully wrapped by the first polymer layer and the second polymer layer.

6. The semiconductor package according to claim 1, wherein the core polymer is a line portion of a core polymer layer.

7. The semiconductor package according to claim 6, wherein the core polymer layer has an opening overlapping the encapsulant and the peripheral region of the substrate, and the opening of the dielectric layer is overlapped with the opening of the core polymer layer.

8. The semiconductor package according to claim 7, wherein the opening of the core polymer layer is larger than the opening of the dielectric layer.

9. The semiconductor package according to claim 7, wherein the core polymer connects opposite sides of the opening of the core polymer layer.

10. The semiconductor package according to claim 7, wherein the core polymer extends in the opening of the core polymer layer, and is separated from rest portion of the core polymer layer.

11. A semiconductor package, comprising:
    a photonic die, comprising:
    a substrate, having a wave guide pattern at a front surface of the substrate; and
    a dielectric layer, covering the front surface of the substrate, and having an opening overlapped with an end portion of the wave guide pattern;
    an encapsulant, laterally encapsulating the photonic die; and
    a wave guide structure, lying on the encapsulant and the photonic die, and extending into the opening of the dielectric layer, to be optically coupled to the wave guide pattern, wherein the wave guide structure comprises:
    a first polymer layer, lying on top surfaces of the encapsulant and the dielectric layer, and further covering a sidewall of the opening of the dielectric layer;
    a first reflective pattern, covering a portion of the first polymer layer extending along the sidewall of the opening of the dielectric layer;
    a core polymer, covering the end portion of the wave guide pattern, and climbing onto the top surfaces of the dielectric layer and the encapsulant along top surfaces of the first reflective pattern and the first polymer layer;
    a second reflective pattern, covering a portion of the core polymer extending along the top surface of the first reflective structure; and
    a second polymer layer, covering the second reflective pattern and the core polymer.

12. The semiconductor package according to claim 11, wherein a portion of the core polymer extending along the sidewall of the opening of the dielectric layer is sandwiched between the first and second reflective patterns.

13. The semiconductor package according to claim 11, wherein the first and second reflective patterns are laterally spaced apart from the wave guide pattern.

14. The semiconductor package according to claim 13, wherein the dielectric layer further laterally surrounds the wave guide pattern, and a bottom end of the first reflective pattern is in contact with the dielectric layer.

15. The semiconductor package according to claim 11, wherein the first and second reflective patterns are formed of metal.

16. A semiconductor package, comprising:
    photonic dies, arranged along rows and columns, and respectively comprising:

a substrate, having a wave guide pattern formed within a peripheral region of a front surface of the substrate; and a dielectric layer, covering the front surface of the substrate, and having an opening overlapped with an end portion of the wave guide pattern;

an encapsulant, laterally encapsulating the photonic dies; and wave guide structures, respectively bridging the end portion of the wave guide pattern from one of the photonic dies to the end portion of the wave guide pattern from an adjacent one of the photonic dies across a portion of the encapsulant in between the adjacent ones of the photonic dies, wherein the wave guide structures respectively comprise a core polymer and a cladding polymer wrapping around the core polymer.

17. The semiconductor package according to claim 16, wherein the core polymers are line-shape portions of a core polymer layer.

18. The semiconductor package according to claim 16, wherein opposite ends of each core polymer are in direct contact with the wave guide patterns from adjacent ones of the photonic dies.

19. The semiconductor package according to claim 17, wherein the core polymer layer has openings in which the core polymers extend.

20. The semiconductor package according to claim 19, wherein the openings of the dielectric layers from adjacent ones of the photonic dies are overlapped by each of the openings of the core polymer layer.

* * * * *